United States Patent
Fan et al.

(10) Patent No.: US 10,292,229 B1
(45) Date of Patent: May 14, 2019

(54) LINE VOLTAGE COMPENSATION CIRCUIT, LED DRIVE SYSTEM AND DRIVE METHOD

(71) Applicant: Shanghai Bright Power Semiconductor Co., Ltd., Shanghai (CN)

(72) Inventors: Minmin Fan, Shanghai (CN); Weijia Yu, Shanghai (CN)

(73) Assignee: Shanghai Bright Power Semiconductor Co., Ltd., Shanghai (CN)

(*) Notice: Subject to any disclaimer, the term of this patent is extended or adjusted under 35 U.S.C. 154(b) by 0 days.

(21) Appl. No.: 16/024,001

(22) Filed: Jun. 29, 2018

(30) Foreign Application Priority Data

Oct. 27, 2017 (CN) .......................... 2017 1 1027164

(51) Int. Cl.
*H05B 33/08* (2006.01)
*H03F 3/45* (2006.01)

(52) U.S. Cl.
CPC ..... *H05B 33/0851* (2013.01); *H03F 3/45475* (2013.01); *H05B 33/0809* (2013.01); *H05B 33/0824* (2013.01); *H03F 2200/129* (2013.01); *H03F 2203/45116* (2013.01)

(58) Field of Classification Search
None
See application file for complete search history.

(56) References Cited

U.S. PATENT DOCUMENTS

2016/0219667 A1* 7/2016 Kim .................... H05B 33/0824
2017/0231045 A1* 8/2017 Hu ...................... H05B 33/0845

FOREIGN PATENT DOCUMENTS

CN 104883798 B 6/2017

OTHER PUBLICATIONS

Feng, "Linear Driver IC BP5112 Application Guide", Bright Power Semiconductor, Mar. 1, 2013 with English translation, 34 pages.

* cited by examiner

*Primary Examiner* — Jany Richardson
(74) *Attorney, Agent, or Firm* — Leber IP Law; David C. Robertson

(57) ABSTRACT

The present disclosure provides a line voltage compensation circuit, an LED drive system and a drive method. The line voltage compensation circuit is configured to receive signal reflecting bus voltage and output line voltage compensation signal based on the received signal reflecting bus voltage, a preset baseline voltage and at least one reference voltage, wherein the line voltage compensation signal has a multi-segment linear relationship with the received signal reflecting bus voltage. In the technical solution provided by the present application, the linear relationship between the feedback voltage of the LED load and the built-in baseline voltage is adjusted based on at least one preset threshold to output segment-based line voltage compensation signal. Compared with the line voltage compensation technology with a single slope, better input voltage line regulation and better LED current line regulation can be obtained by adopting the technical solution provided by the present application.

27 Claims, 11 Drawing Sheets

US 10,292,229 B1

LINE VOLTAGE COMPENSATION CIRCUIT, LED DRIVE SYSTEM AND DRIVE METHOD

TECHNICAL FIELD

The present application relates to the technical field of lighting, and in particular to a line voltage compensation circuit, an LED drive system and a drive method.

BACKGROUND OF THE INVENTION

It is common to adopt an open-loop operating manner in a linear drive circuit of a load such as an LED load, and in order to prevent an overhigh input power when the line voltage is slightly higher, a line voltage compensation circuit is often considered to be added. In one embodiment shown in FIG. 1, a line voltage sampling circuit constituted by a resistor RD and current mirrors M0 and MOSFET M1 samples the voltage at a DRAIN side (namely, a voltage drop obtained by subtracting an LED load from the line voltage VBUS) of a power tube and outputs current, since an output current of the line voltage sampling circuit is in direct proportion to the voltage at a DRAIN side of the MOSFET Mpwr, a resistor Rcmp regulates the baseline voltage VREF based on a current output by the sampling circuit, and a drive voltage VREF' is output to an operational amplifier Amp to drive the MOSFET Mpwr, and a source voltage VCS of the MOSFET Mpwr follows the drive voltage VREF', in this way, the LED load current is equal to VCS/Rcs.

The technical solution provided by FIG. 1 adopts a line voltage compensation technology with a single slope, and the technical solution has the shortcoming that the LED load's current line regulation is contradictory to the input voltage's line regulation, namely, the drive voltage VREF' has an inversely proportional linear relationship with the voltage at a DRAIN side of the MOSFET Mpwr, as shown in FIG. 2, in other words, if better input voltage's line regulation is desired, the LED load's current line regulation will be poorer.

SUMMARY OF THE INVENTION

In view of the above shortcomings in the prior art, the objective of the present application is to provide a line voltage compensation circuit, an LED drive system and a drive method, aiming at adopting a segment-based line voltage compensation technology to obtain simultaneously better input voltage line regulation and better LED load current line regulation.

In one aspect, the present application provides a line voltage compensation circuit. The line voltage compensation circuit is configured to receive signal reflecting bus voltage and output line voltage compensation signal based on the received signal reflecting bus voltage, a preset baseline voltage and at least one reference voltage, wherein the line voltage compensation signal has a multi-segment linear relationship with the received signal reflecting bus voltage.

In some embodiments, the signal reflecting bus voltage are generated by a voltage division unit based on the bus voltage or a voltage of a terminal of a load.

In some embodiments, the line voltage compensation circuit comprises: a first control signal generation module, configured to receive a first reference voltage and output a first control signal based on the first reference voltage; and a line voltage generation module, electrically connected with the first control signal generation module, and configured to receive the signal reflecting bus voltage, the first control signal and the baseline voltage and generate the line voltage compensation signal based on the received signal reflecting bus voltage, the first control signal and the baseline voltage.

In some embodiments, the line voltage generation module comprises: a first current mirror connected with a constant voltage source; a first switching device, wherein a drain thereof is connected with the first current mirror and a source thereof is grounded via a first resistor; a first operational amplifier, wherein a positive input terminal thereof is configured to receive the signal reflecting bus voltage, a negative input terminal thereof is configured to receive the first control signal, and an output terminal thereof is connected with a gate of the first switching device; and a second current mirror, wherein an input terminal thereof is connected with an output terminal of the first current mirror and an output terminal thereof is used for outputting the generated line voltage compensation signal based on the baseline voltage.

In some embodiments, the first control signal generation module comprises: a third current mirror connected with a constant voltage source, wherein an output terminal thereof is connected with the line voltage generation module; a second switching device, wherein a drain thereof is connected with a common gate of the third current mirror and a source thereof is grounded via a second resistor; and a second operational amplifier, wherein a positive input terminal thereof is connected with a generation circuit of a first reference voltage, a negative input terminal thereof is connected with a source of the second switching device, and an output terminal thereof is connected with a gate of the second switching device.

In some embodiments, the first control signal generation module comprises: a transconductance amplifier, wherein a positive input terminal thereof is connected with the generation circuit of a first reference voltage, and a negative input terminal thereof is connected with the line voltage generation module; and a fourth current mirror, wherein an input terminal thereof is connected with an output terminal of the transconductance amplifier and an output terminal thereof is connected with the line voltage generation module.

In some embodiments, the line voltage compensation circuit further comprises: a second control signal generation module, which is electrically connected with the line voltage generation module and configured to receive a second reference voltage and the line voltage compensation signal, and to shunt the current flowing through the line voltage generation module when the line voltage compensation signal is smaller than or equal to the second reference voltage.

In some embodiments, the second control signal generation module comprises: a transconductance amplifier, wherein a positive input terminal thereof is configured to receive the second reference voltage, and a negative input terminal thereof is connected with the line voltage generation module; and a fourth current mirror, wherein an input terminal thereof is connected with an output terminal of the transconductance amplifier, and an output terminal thereof is connected with the line voltage generation module.

In some embodiments, the line voltage compensation circuit further comprises a third control signal generation module, which is electrically connected between the line voltage generation module and the second control signal generation module and configured to receive a third reference voltage and the line voltage compensation signal, and to cut off a current path through which the current flows from the line voltage generation module to the second control signal generation module when the line voltage compensation signal is smaller than or equal to the third reference voltage.

In some embodiments, the third control signal generation module comprises: a third operational amplifier, wherein a negative input terminal thereof is configured to receive the third reference voltage, and a positive input terminal thereof is connected with the second control signal generation module; and a third switching device electrically connected with the line voltage generation module and an output terminal of the third operational amplifier.

In some embodiments, the line voltage compensation circuit further comprises a baseline voltage generation circuit configured to generate the baseline voltage and multiple reference voltages.

In some embodiments, the line voltage compensation circuit is electrically connected with the baseline voltage generation circuit via a resistor.

In another aspect, the present application provides a driver. The driver comprises: the line voltage compensation circuit, being configured to receive signal reflecting bus voltage and output line voltage compensation signal based on the received signal reflecting bus voltage, a preset baseline voltage and at least one reference voltage, wherein the line voltage compensation signal has a multi-segment linear relationship with the received signal reflecting bus voltage; and a drive unit, connected with the line voltage compensation circuit and a load, and configured to drive the load based on the received line voltage compensation signal and a following voltage of the load.

In some embodiments, the drive unit comprises: a power device, wherein a drain thereof is connected with the load, and a source thereof is grounded via a sampling unit; and an operational amplifier, wherein a positive input terminal thereof is connected with the line voltage compensation circuit, a negative input terminal thereof is connected with the sampling unit to acquire the following voltage of the load, and an output terminal thereof is connected with a gate of the power device.

In yet another aspect, the present application provides an LED drive system. The LED drive system comprises: a rectifying unit configured to rectify a current input by an external AC and output the rectified current to an LED load; an energy storage unit connected with an input terminal and an output terminal of the LED load; the line voltage compensation circuit, being configured to receive signal reflecting bus voltage and output line voltage compensation signal based on the received signal reflecting bus voltage, a preset baseline voltage and at least one reference voltage, wherein the line voltage compensation signal has a multi-segment linear relationship with the received signal reflecting bus voltage, which is connected with the LED load; and a drive unit, connected with the line voltage compensation circuit and the LED load, and configured to drive the LED load based on the received line voltage compensation signal and the following voltage of the LED load.

In some embodiments, the LED drive system further comprises a voltage division unit which is connected with an terminal of the LED load and the line voltage compensation circuit, and configured to generate the signal reflecting bus voltage by dividing the voltage of a terminal of the LED load and output the signal reflecting bus voltage to the line voltage compensation circuit.

In some embodiments, the LED drive system further comprises a sampling unit connected between the drive unit and the ground, configured to output the following voltage of the LED load.

In some embodiments, the drive unit comprises: a power device, wherein a drain thereof is connected with the load, and a source thereof is grounded via a sampling unit; and an operational amplifier, wherein a positive input terminal thereof is connected with the line voltage compensation circuit, a negative input terminal thereof is connected with the sampling unit to acquire the following voltage of the load, and an output terminal thereof is connected with a gate of the power device.

In some embodiments, the LED drive system further comprises a dimming unit configured to adjust the bus voltage so as to correspondingly adjust the brightness of the LED load; correspondingly, the line voltage compensation circuit is configured to receive the signal reflecting bus voltage which is output after being adjusted by the dimming unit, and output the line voltage compensation signal based on the signal reflecting bus voltage, a preset baseline voltage and at least one reference voltage.

In some embodiments, the dimming unit comprises a triac dimmer.

In another aspect, the present application provides a line voltage compensation method. The line voltage compensation method comprises the following steps: acquiring the signal reflecting bus voltage; and outputting the line voltage compensation signal based on the signal reflecting bus voltage, a preset baseline voltage and at least one reference voltage, wherein the line voltage compensation signal has a multi-segment linear relationship with the signal reflecting bus voltage.

In some embodiments, the step of acquiring the signal reflecting bus voltage comprises: acquiring in real time a voltage of an terminal of the load located on a bus or bus voltage; generating the signal reflecting bus voltage by a division unit based on the bus voltage or the voltage of a terminal of a load.

In some embodiments, the preset baseline voltage is generated by a baseline voltage generation unit.

In some embodiments, the step of outputting the line voltage compensation signal based on the signal reflecting bus voltage, a preset baseline voltage and at least one reference voltage comprises: when comparing the signal reflecting bus voltage and a first reference voltage, outputting a first control signal based on the compared results; and outputting the line voltage compensation signal based on the signal reflecting bus voltage, the first control signal and the baseline voltage.

In some embodiments, the step of outputting the line voltage compensation signal based on the signal reflecting bus voltage, a preset baseline voltage and at least one reference voltage comprises: outputting the line voltage compensation signal based on the compared result between a fed-back line voltage compensation signal and preset at least one reference voltage, the signal reflecting bus voltage and the fed-back line voltage compensation signal.

In some embodiments, the step of outputting the line voltage compensation signal based on the signal reflecting bus voltage, a preset baseline voltage and at least two reference voltages comprises: comparing the signal reflecting bus voltage and a preset first reference voltage, outputting a first control signal based on the compared results; and outputting the line voltage compensation signal based on the signal reflecting bus voltage, the first control signal and the baseline voltage; when detecting that a fed-back line voltage compensation signal is smaller than or equal to a preset second reference voltage, outputting the line voltage compensation signal based on the signal reflecting bus voltage, the first control signal, the second reference voltage and the baseline voltage; wherein the second reference voltage is smaller than the first reference voltage.

In some embodiments, the step of outputting the line voltage compensation signal based on the signal reflecting bus voltage, a preset baseline voltage and at least three reference voltages comprises: comparing the signal reflecting bus voltage and a preset first reference voltage, outputting a first control signal based on the compared result; and outputting the line voltage compensation signal based on the signal reflecting bus voltage, the first control signal and the baseline voltage; when detecting that a fed-back line voltage compensation signal is smaller than or equal to a preset second reference voltage, outputting the line voltage compensation signal based on the signal reflecting bus voltage, the first control signal, the second reference voltage and the baseline voltage; and when detecting that a fed-back line voltage compensation signal is smaller than the third reference voltage, outputting the line voltage compensation signal based on the signal reflecting bus voltage, the first control signal, the second reference voltage, the third reference voltage and the baseline voltage; wherein the second reference voltage is smaller than the first reference voltage, and the third reference voltage is smaller than the second reference voltage.

In some embodiments, the line voltage compensation method further comprises the following steps: generating a drive signal based on the line voltage compensation signal and a sampling signal; and outputting the drive signal to drive a load.

In some embodiments, the sampling signal is output by a sampling unit, which is configured to sampling the current flows through a power device connected with the load, wherein the load is LED load.

As mentioned above, in the line voltage compensation circuit, the LED drive system and the drive method in the present application, the linear relationship between the feedback voltage of the LED load and the built-in baseline voltage is adjusted based on at least one preset threshold to output segment-based line voltage compensation signal. Compared with the line voltage compensation technology with a single slope, better input voltage line regulation and better LED current line regulation can be obtained by adopting the technical solution provided by the present application, meanwhile, in the technical solution provided by the present application, an open implementation is adopted, which enables peripheral circuits to be simpler.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are employed, and the accompanying drawings (also "figure" and "FIG." herein), of which:

DETAILED DESCRIPTION

Figure 1:
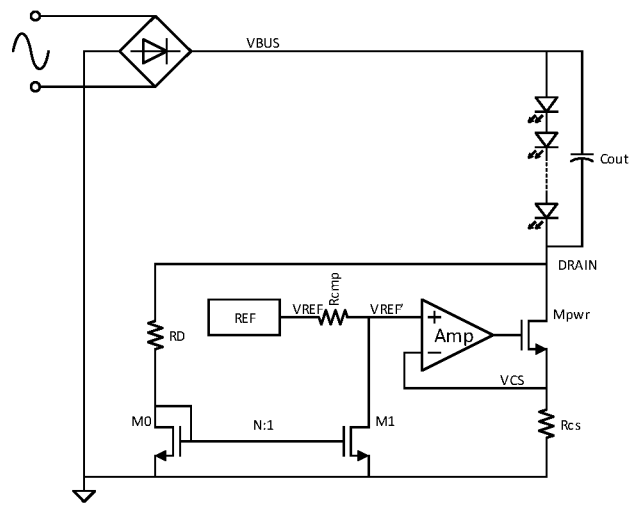
FIG. 1 is a structural schematic diagram of a common line voltage compensation circuit.
Figure 2:
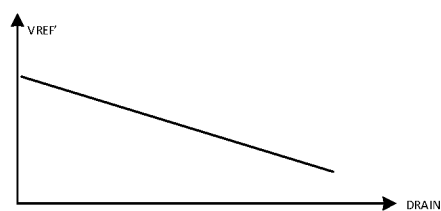
FIG. 2 is a schematic diagram of the linear relationship between the VREF' and the voltage at a DRAIN side in the line voltage compensation circuit shown in FIG. 1.

Implementations of the present application will be described below through specific embodiments, and those skilled in the art can easily understand other advantages and effects of the present application from the contents disclosed in the present specification.

It should be noted that, the structures, proportions, sizes and the like drawn in the drawings of the present specification are merely used for coordinating with the contents disclosed in the specification, so as to facilitate understanding and reading by those skilled in the art, rather than for limiting the qualifications based on which the present application can be implemented, therefore, they do not have substantive technical meanings. Any modification of the structure, variation of the proportional relationship or adjustment of the size shall all fall within the scope of the technical contents disclosed by the present application on the premise of not influencing the efficacy generated by the present application and the purpose achieved by the present application. Meanwhile, such terms as "up", "down", "left", "right", "middle" and "one" referred to in the present specification are merely used for a clear description, rather than for defining the scope in which the present application can be implemented, the variation or adjustment of the relative relationship in the structures shall be deemed as falling within the scope in which the present application can be implemented under the premise of not having a substantive change of the technical contents.

Moreover, as used herein, such single forms as "one", "a" and "the" aim at also including the plural forms, unless contrarily indicted in the text. It should be further understood that, such terms as "comprise" and "include" indicate the existence of the features, steps, operations, elements, components, items, types and/or groups, but do not exclude the existence, emergence or addition of one or more other features, steps, operations, elements, components, items, types and/or groups. The terms "or" and "and/or" used herein are explained to be inclusive, or indicate any one or any combination. Therefore, "A, B or C" or "A, B and/or C" indicates "any of the following: A; B; C; A and B; A and C; B and C; A, B and C". Exceptions of the definition only exist when the combinations of elements, functions, steps or operations are mutually exclusive inherently in some ways.

Figure 3:
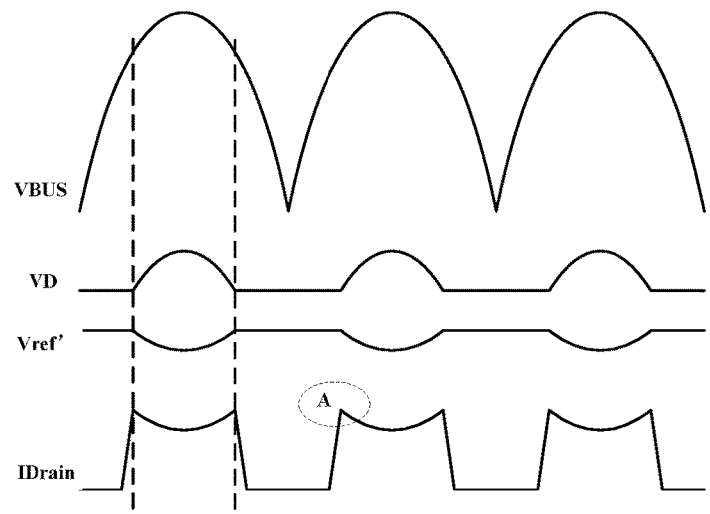
FIG. 3 is a waveform diagram of the voltage and current at a load side under compensation of the line voltage compensation signal as shown in FIG. 2.

Please refer to FIG. 3 which is a waveform diagram of a power supply voltage VBUS of a load under no compensation, a sampled signal voltage VD which drives a load to operate, a compensation signal voltage Vref' which is subjected to single linear compensation, and a load operating voltage signal IDrain after single linear compensation. Wherein the IDrain current under line voltage compensation has a peak A in a switching instant between valid power supply and incapability of power supply, which not only indicates that the input power source supplies power to the load at intervals, but also indicates that power supply voltage during an intersected instant between valid power supply and incapability of power supply in each power supply period under a single linear compensation manner is jittered. Based on an analysis on the waveform in FIG. 3, users will feel dazzling or have other discomfortableness under a lighting environment utilizing such an LED load.

Based on the application of single linear compensation in the LED drive system and spreading to other drive systems which need to compensate power supply to the load by utilizing a linear compensation circuit, the present application provides a line voltage compensation circuit so as to provide compensation signal which enables the change of bus voltage to be gentler. Herein, the line voltage compensation circuit receives signal reflecting bus voltage, and outputs line voltage compensation signal based on the signal reflecting bus voltage, a preset baseline voltage and at least one reference voltage. Wherein the bus circuit is a circuit in which an input power source is connected with a load, the input power source includes alternating current utility power supply and a rectifying unit, and the rectifying unit rectifies the AC and then outputs to a load. The line voltage compensation signal has a multi-segment linear relationship with the signal.

Figure 4:
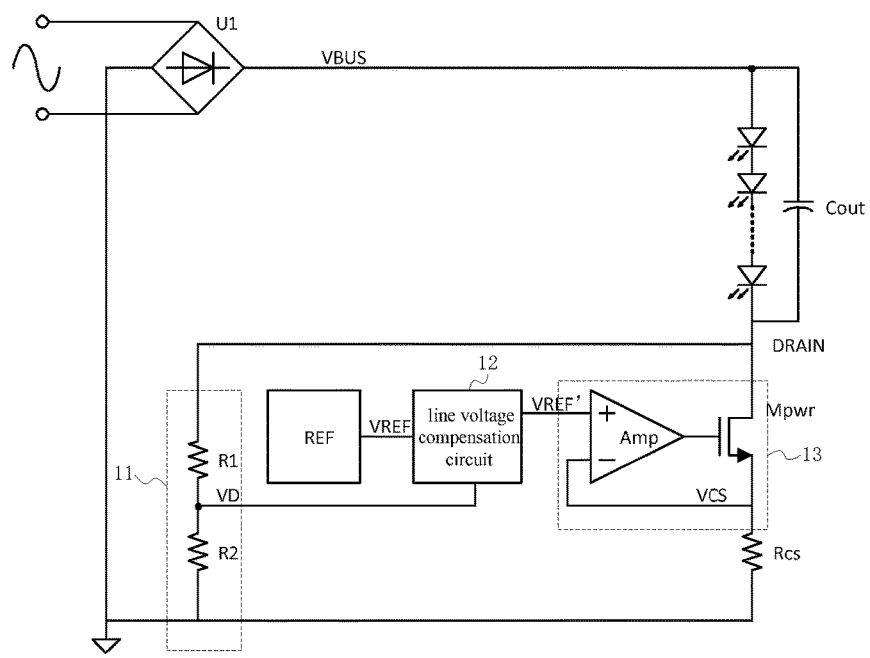
FIG. 4 is a structural schematic diagram showing the connection between the line voltage compensation circuit in the present application and the bus circuit in one implementation.

Herein, the signal reflecting bus voltage can be directly acquired from the bus circuit or load circuit which supplies power to the load. For example, the power supply line is connected with a sampling resistor, and the line voltage compensation circuit acquires the signal reflecting bus voltage from the output terminal of the sampling resistor. In some implementations, the signal reflecting bus voltage are generated by a voltage division unit based on the detected bus voltage or a voltage of a terminal of a load. Wherein the voltage division unit can be a resistor string which is connected between a bus circuit and the ground, or the voltage division unit can be a resistor string which is connected between a load circuit and the ground. The grounded resistor string is utilized to divide a branch circuit reflecting the change of current and voltage on the bus circuit from power supply line which supplies power to the load, and the line voltage compensation circuit acquires signal reflecting bus voltage from the branch circuit. For example, please refer to FIG. 4 which is a circuit schematic diagram showing the connection between the line voltage compensation circuit 12 and a load circuit via a voltage division unit 11. Wherein, the voltage division unit 11 is connected between drain (DRAIN side) of power tube (MOSFET) and the ground. The load circuit is connected with a drive circuit 13, a load connected in series with the drive circuit 13 and other peripheral circuits. Wherein, when the bus voltage (such as VBUS) reaches the voltage which enables the load to operate, the bus circuit loop is turned on, and the drive circuit 13 enables the load to operate, and when the bus voltage (such as VBUS) cannot reach the voltage which enables the load to operate, the bus circuit loop is turned off. Wherein the drive circuit in FIG. 4 includes a power device, and the power device can be a MOSFET and the like. The voltage division unit is connected with a drain (DRAIN side) of the power device, and the linear compensation circuit 12 acquires the signal VD reflecting bus voltage from a resistor side of the voltage division unit 11.

The baseline voltage is directly supplied by a constant voltage source (also called baseline voltage generation circuit) or is supplied by voltage division from a voltage signal or a constant voltage. The constant voltage source can be dedicated to the line voltage compensation circuit, and can also be shared with other constant voltage sources in the chip in which the line voltage compensation circuit is located. In some embodiments, the baseline voltage is generated by baseline voltage generation circuit, which is provided to the line voltage compensation circuit via a resistor, and to be grounded. The linear compensation circuit can adjust the current flows through the resistor, so as the line voltage compensation circuit outputs a linear compensation signal which varied with the adjusted current correspondingly.

As a segment-based node voltage which performs linear compensation on the bus voltage, the reference voltage is a constant voltage supplied by a constant voltage source. Based on the design requirements of a line voltage compensation circuit, the reference voltage can serve as a segment-based node voltage that line voltage compensation circuit performs segment-based compensation based on the change of signal reflecting bus voltage. For example, the line voltage compensation circuit compares the reference voltage with voltage of the signal reflecting bus voltage, and selects a line voltage compensation path based on the comparative results to output the line voltage compensation signal, such that corresponding to different comparative results, the line voltage compensation signal has different linear relationships with the signal reflecting bus voltage. The reference voltage can also serve as a segment-based node voltage that line voltage compensation circuit performs segment-based compensation based on the change of the line voltage compensation signal. For example, the line voltage compensation circuit compares the reference voltage with voltage of the line voltage compensation signal, wherein the line voltage compensation signal is acquired through performing linear compensation on bus voltage based on the signal reflecting bus voltage; based on the comparative results, a line voltage compensation path is selected to output line voltage compensation signal, such that corresponding to different comparative results, the line voltage compensation signal has different linear relationships with the signal reflecting bus voltage. In consideration of cost and user experience sensitivity, one reference voltage or two reference voltage is considered. For example, the reference voltage only includes one voltage value v1, the reference voltage v1 serves as a segment-based node voltage of linear compensation, the line voltage compensation circuit supplies line voltage compensation signal with the first linear relationship between the baseline voltage Vref and v1, and supplies line voltage compensation signal with the second linear relationship between voltage v1 and a grounded voltage. For another example, the reference voltage includes voltage values v1 and v2, wherein v1 is greater than v2, the reference voltages v1 and v2 serve as the segment-based node voltage of linear compensation, the line voltage compensation circuit supplies line voltage compensation signal with the first linear relationship between the baseline voltage Vref and v1, supplies line voltage compensation signal with the second linear relationship between voltage v1 and v2, and supplies line voltage compensation signal with the third linear relationship between voltage v2 and a grounded voltage. In order to make a more detailed division of the linear relationship between the line voltage compensation signal and the received signal reflecting bus voltage, such that multi-segment linear compensation is more fit to the changing of line voltage, more reference voltages can be set in the line voltage compensation circuit in a sequence from big to small.

It should be noted that, each linear relationship should be understood in a broad sense. The linear relationship includes the linear relationship with a nonzero linear coefficient between the voltage of the line voltage compensation signal and the received signal reflecting bus voltage, or the linear relationship with zero linear coefficient between the voltage of the line voltage compensation signal and the received signal reflecting bus voltage.

In one implementation, the line voltage compensation circuit includes a first control signal generation module and a line voltage generation module. Wherein the first control signal generation module receives a first reference voltage and outputs a first control signal based the reference voltage. Wherein the first reference voltage belongs to one of the above reference voltages. The line voltage generation module is electrically connected with the first control signal generation module, and is configured to receive the signal reflecting bus voltage, the first control signal and the baseline voltage and generate the line voltage compensation signal based on the received signal reflecting bus voltage, the first control signal and the baseline voltage.

Figure 5:
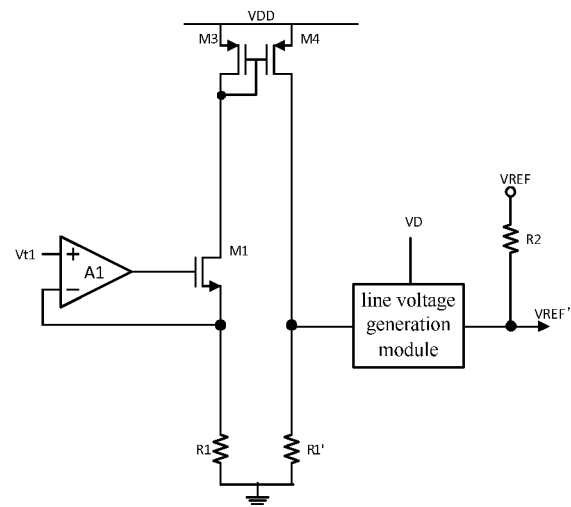
FIG. 5 is a schematic diagram of circuit structural of the first control signal generation module in the line voltage compensation circuit in the present application in one implementation.

Please refer to FIG. 5 which is a schematic diagram of a circuit structure of the first control signal generation module in one implementation, wherein the first reference voltage received by the first control signal generation module is a reference voltage set based on the change of signal reflecting bus voltage. The first control signal generation module includes: a third current mirror, a second switching element M1 and a second operational amplifier A1. Wherein the third current mirror includes a pair of MOSFET (M3 and M4) with a common gate, drains of the pair of MOSFET (M3 and M4) are connected with a constant voltage source VDD together, and an output terminal of the third current mirror is connected with the line voltage generation module. A drain of the second switching device M1 is connected with the common gate of the third current mirror, and a source thereof is grounded via a second resistor R1. A positive input terminal of the second operational amplifier A1 is connected with a generation circuit of a first reference voltage, a negative input terminal thereof is connected with a source of the second switching device M1, and an output terminal thereof is connected with a gate of the second switching device M1. Wherein in order to output the first control signal generated based on the first reference voltage, the second switching device M1 needs to be in a normally turn-on state, and by utilizing the second resistor R1 connected with the input terminal of the third current mirror, the third current mirror transmits the first reference voltage to the output terminal of the third current mirror, and the output terminal of the third current mirror then outputs the first control signal corresponding to the first reference voltage vt1 based on the connected resistor R1'. Wherein under the influence of the resistance of the resistors R1 and R1', the first control signal voltage can be equal to the first reference voltage vt1 or can be obtained by performing voltage division on the first reference voltage vt1. The first control signal is output to the line voltage generation module. The line voltage generation module receives the signal VD reflecting bus voltage, and compares the voltage of signal reflecting bus voltage VD with the first control signal voltage, when the voltage of signal reflecting bus voltage VD falls within an amplification interval set based on the first control signal voltage, a linear compensation signal is generated and output, and when the voltage of signal reflecting bus voltage VD does not fall within the amplification interval set based on the first control signal voltage, another linear compensation signal is generated and output.

Figure 6:
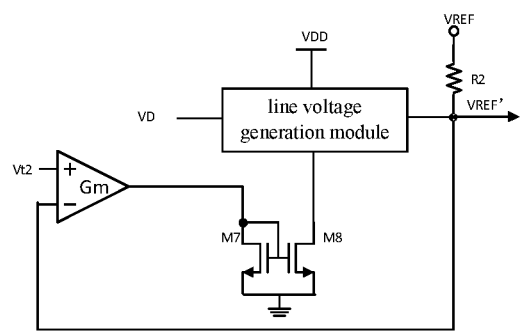
FIG. 6 is a schematic diagram of circuit structural of the first control signal generation module in the line voltage compensation circuit in the present application in another implementation.

Please refer to FIG. 6 which is a schematic diagram of a circuit structure of the first control signal generation module in another implementation, wherein the first reference voltage received by the first control signal generation module is a reference voltage value set based on the change of the line voltage compensation signal. The first control signal generation module includes: a transconductance amplifier Gm and a fourth current mirror. A positive input terminal of the transconductance amplifier Gm is connected with a generation circuit of a first reference voltage, and a negative input terminal thereof is connected with an output terminal of the line voltage generation module. The fourth current mirror includes a pair of MOSFET (M7 and M8) with a common gate, drains of the pair of MOSFET (M7 and M8) are grounded together, an input terminal of the fourth current mirror is connected with an output terminal of the transconductance amplifier, and an output terminal thereof is connected with the input terminal of the line voltage generation module. Wherein the generation circuit of the first reference voltage can include a constant voltage source, and can even include a resistor divider connected with the constant voltage source. The transconductance amplifier Gm performs amplification and integration treatment on an error between the obtained Vref' of line voltage compensation signal output by the line voltage generation module and the first reference voltage vt2, so as to obtain a first control signal reflecting an average of the voltage of the line voltage compensation signal. The line voltage compensation circuit output the line voltage compensation signal Vref by adjusting the current flows through the resistor R2 connected with the baseline voltage generation circuit. One terminal of the resistor R2 can access a baseline voltage Vref, while the other terminal is connected with the output terminal of the line voltage generation module. The first control signal is transmitted to the input terminal of the line voltage generation module via the fourth current mirror (M7 and M8). The line voltage generation module receives the signal reflecting bus voltage, and compares the voltage of the signal reflecting bus voltage with the first control signal voltage, when the voltage of signal reflecting bus voltage VD falls within an amplification interval set based on the first control signal voltage, a linear compensation signal is generated and output, and when the voltage of signal reflecting bus voltage VD does not fall within the amplification interval set based on the first control signal voltage, another linear compensation signal is generated and output.

Figure 7:
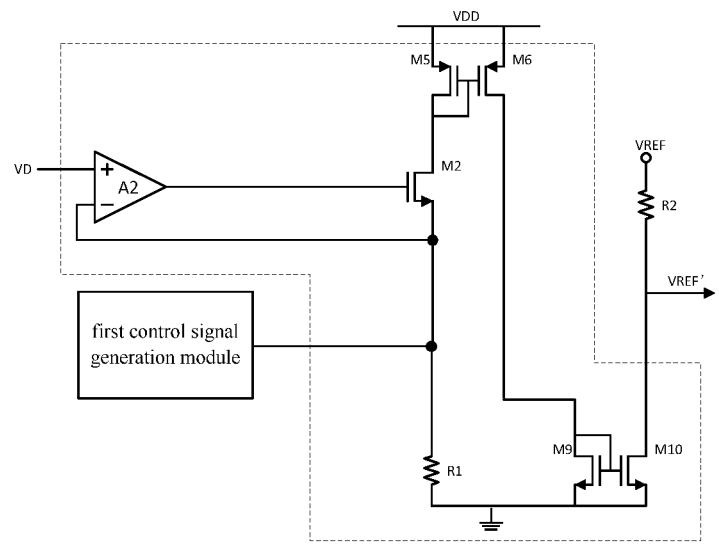
FIG. 7 is a schematic diagram of circuit structural of the line voltage generation module in the line voltage compensation circuit in the present application in one implementation.

Please refer to FIG. 7 which is a schematic diagram of a circuit structural of the line voltage generation module. The line voltage generation module includes: a first current mirror, a first switching device M2, a first operational amplifier A2 and a second current mirror. Wherein the first current mirror includes a pair of MOSFET (M5 and M6) with a common gate, and drains of the pair of MOSFET (M5 and M6) are connected with a constant voltage source together. A drain of the first switching device M2 is connected with an input side of the first current mirror, and a source thereof is grounded via a first resistor R1. A positive input terminal of the first operational amplifier A2 receives the signal reflecting bus voltage, a negative input terminal thereof receives the first control signal, and an output terminal thereof is connected with a gate of the first switching device M2. The second current mirror includes a pair of MOSFET (M9 and M10) with a common gate, drains of the pair of MOSFET (M9 and M10) are grounded together, input terminals thereof are connected with the output terminal of the first current mirror, and output terminals thereof output line voltage compensation signal which are adjusted based on the voltage signal output by the first operational amplifier A2 and generated based on the baseline voltage. In FIG. 7, the output terminal of the second current mirror is further connected with the baseline voltage source Vref via the resistor R2, the voltage signal output by the first operational amplifier A2 are transmitted to the second current mirror, the resistor R1 and the second current mirror, and the voltage of the line voltage compensation signal Vref' output by the second current mirror is represented as follows: $V_{ref'}=(V_{ref}-V_{R2})$ wherein $V_{R2}$ is a voltage drop reflecting on the resistor R2 based on the change of the current output by the second current mirror. In view of the baseline voltage Vref is provided by a constant voltage source, and provided to the line voltage generation module via a Resistor R2, the line voltage generation module can adjust the current flows through R2, and the line voltage generation module can output the linear voltage compensation signal $V_{ref'}=(V_{ref}-V_{R2})$.

Figure 8:
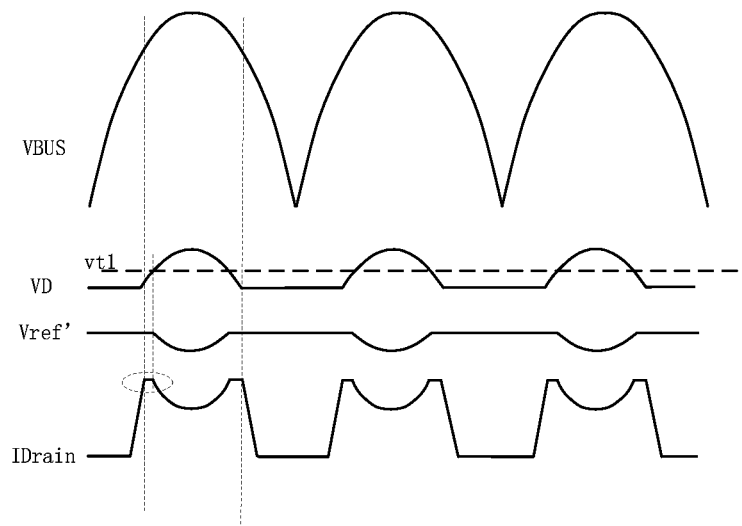
FIG. 8 is a waveform diagram showing that the line voltage compensation circuit obtained in combination with FIG. 5 and FIG. 7 supplies line voltage compensation signal correspondingly along with the change of the acquired signal VD reflecting bus voltage.
Figure 21:
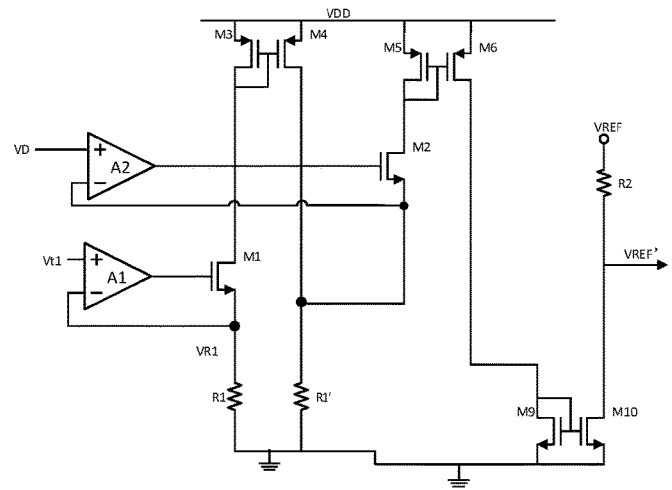
FIG. 21 is a structural schematic diagram of the line voltage compensation circuit in the present application in one implementation.

Please refer to FIG. 8 and FIG. 21. FIG. 21 is a structural schematic diagram of the line voltage compensation circuit obtained in combination with FIG. 5 and FIG. 7. And FIG. 8 is a waveform diagram showing that the circuit in FIG. 21 supplies line voltage compensation signal correspondingly along with the change of the acquired signal reflecting bus voltage. As shown in FIG. 21, due to the negative feedback of the second operational amplifier A1, as a buffer, the second operational amplifier A1 makes the first reference voltage vt1 basically equal to the following voltage VR1. Meanwhile, the first control signal is output to the line voltage generation module, specifically, the first reference voltage vt1 is transmitted to the input terminals of the first current mirrors M5 and M6 (i.e., input terminals of M5 and M6 in FIG. 7) via the third current mirrors M3 and M4 (i.e., output terminals of M3 and M4 in FIG. 5). Based on the connection relationship between input terminals of the first operational amplifier A2, the negative input terminal of the first operational amplifier A2 receives an feedback signal, the feedback signal varied with the first control signal output by the third current mirrors (M3 and M4) included in first control signal generation module and the signal output by the first operational amplifier A2. In order to make VD fall within an amplification interval set based on the first control signal, the first control signal is greater than the minimum value of VD. Resistor R1 connected with the input terminal of the first current mirror in FIG. 7 or Resistor R1' connected with the output terminal of the third current mirror in FIG. 5 corresponds to R1' in FIG. 21. When VD gradually becomes larger from its minimum value, and in the period in which VD is smaller than vt1, the voltage difference between the voltage of first control signal provided by the first control signal generation module and the received signal VD does not suffice to fall within the linear amplification interval of the first operational amplifier A2, then the first switching device M2 in the line voltage generation module is turned off, the line voltage generation module does not output voltage signal, then the Vref' of line voltage compensation signal is equal to Vref. In the period in which VD is greater than or equal to vt1, the voltage difference between the voltage of first control signal provided by the first control signal generation module and the received signal VD falls within the linear amplification interval of the first operational amplifier A2, then the first switching device M2 in the line voltage generation module is turned on, the voltage difference amplified by the first operational amplifier A2 is output via the first current mirror and the second current mirror, then the Vref' of line voltage compensation signal satisfies the following formula: $V_{ref'}=(V_{ref}-V_{R2})$. When the acquired signal VD voltage gradually becomes smaller from its maximum value, before VD declines to vt1, line voltage compensation signal is still output based on the formula $V_{ref'}=(V_{ref}-V_{R2})$; when the acquired signal VD voltage declines to be smaller than vt1, the line voltage generation module does not output voltage signal, then the Vref' of line voltage compensation signal is equal to Vref. The Vref' of line voltage compensation signal is fed back onto the circuit loop and forms an IDrain current waveform as shown in FIG. 8. It can be seen that in an instant duration in the valid power supply region of bus IDrain and close to the invalid power supply region, the change of the current flowing through a load is gentler than that in single linear compensation, and has no peak A as shown in FIG. 3.

It should be noted that, the manner that the positive input terminal of the first operational amplifier A2 receives the signal VD reflecting the bus voltage, and the negative input terminal thereof receives the first control signal is merely an example, rather than limiting the present application. In fact, according to the technical idea provided by the present application, in conjunction with the actual circuit design, the first operational amplifier A2 may also receive the first control signal at the positive input terminal and receive the signal VD reflecting the bus voltage at negative input terminal. A linear compensating circuit designed, based on the technical idea of the present application, to include the positive input terminal of the first operational amplifier A2 receiving the first control signal and the negative input terminal of the first operational amplifier A2 receiving the signal VD reflecting the bus voltage will not be described in detail.

Figure 9:
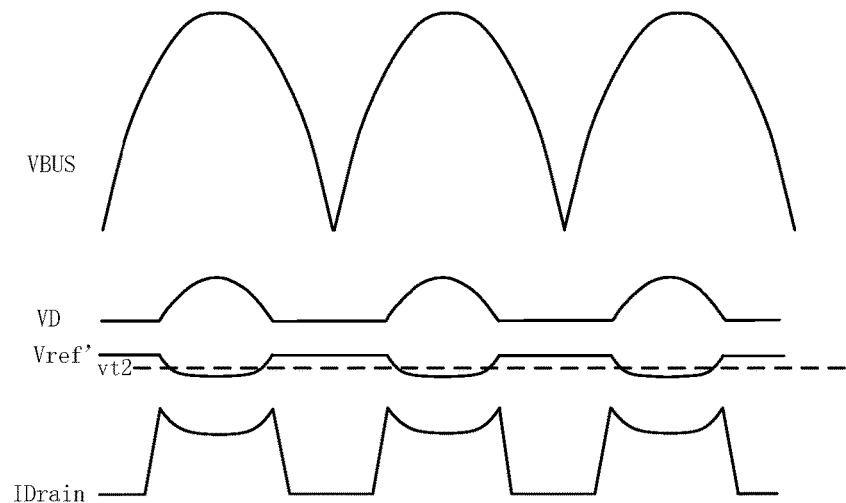
FIG. 9 is a waveform diagram showing that the line voltage compensation circuit obtained in combination with FIG. 6 and FIG. 7 supplies line voltage compensation signal correspondingly along with the change of the acquired signal VD reflecting bus voltage.
Figure 22:
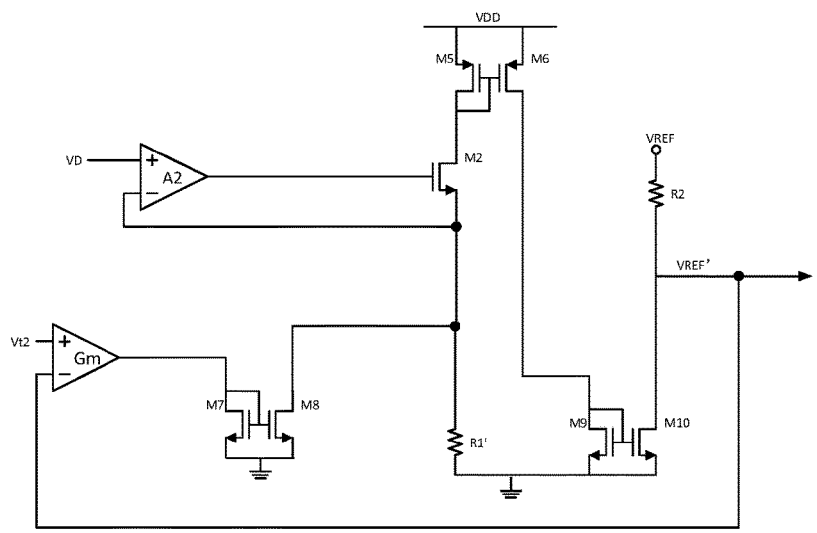
FIG. 22 is a structural schematic diagram of the line voltage compensation circuit in the present application in another implementation.

Please refer to FIG. 9 and FIG. 22. FIG. 22 is a line voltage compensation circuit obtained in combination with FIG. 6 and FIG. 7. And FIG. 9 is a waveform diagram showing that the line voltage compensation circuit in FIG. 22 supplies line voltage compensation signal correspondingly along with the change of the acquired signal VD reflecting bus voltage. Wherein the first reference voltage vt2 is smaller than the baseline voltage Vref; an input terminal of the line voltage generation module is connected with an output terminal of the first control signal generation module, e.g., the MOSFET M8 shown in FIG. 6 and the MOSFET M9 shown in FIG. 7 have common source. When VD increases from its minimum value along with the bus voltage, based on the received signal VD and the following voltage provided by the input side of the first current mirror (M5 and M6), the first operational amplifier A2 as shown in FIG. 7 is in a linear amplification interval, voltage signal output by the first operational amplifier A2 effects on a resistor R2 via the first current mirror and the second current mirror, such that Vref' gradually drops from Vref in the first linear relationship and finally close to vt2; meanwhile, when Vref' is greater than vt2, since the voltage at a negative input terminal of transconductance amplifier Gm is greater than the voltage at a positive input terminal of transconductance amplifier Gm, a transconductance amplifier Gm outputs a negative current, which enables the fourth current mirror to be in a turn-off state. When Vref' voltage drops to be close to vt2 and further satisfies that vt2 is greater than or equal to Vref', Gm begins to output a positive current, namely, output a first control signal. The first control signal voltage turns on the fourth current mirror (M7 and M8), such that the fourth current mirror (M7 and M8) shunts the current flowing to the second current mirror (M9 and M10) in the line voltage generation module. In this way, the current at an output terminal of the second current mirror declines in a lower speed, and Vref' declines continuously in a second linear relationship along with the rise of the VD voltage. In the period in which VD declines from its maximum value along with the bus voltage, the line voltage compensation signal output by the line voltage compensation circuit firstly rise according to the second linear relationship, and then rise according to the first linear relationship. The bus waveform which is fed back is as shown by the IDrain waveform in FIG. 9. It can be seen that in the period in the valid power supply region of bus IDrain and close to a voltage peak, the change of the current flowing through a load is gentler than that in single linear compensation.

It should be noted that the manner in which the positive and negative input terminals of the transconductance Gm receive the signal is merely an example, rather than limiting the present application. In fact, according to the technical idea provided by the present application, in conjunction with an actual circuit design, the transconductance Gm may also receive the fed-back line voltage compensation signal at the positive input terminal and receive the first reference voltage vt2 at the negative input terminal. A linear compensating circuit designed, based on the technical idea of the present application, to include the positive input terminal of the transconductance Gm receiving the fed-back line voltage compensation signal and the negative input terminal receiving the first reference voltage vt2 will not be described in detail.

Based on the above two intervals of segment-based control of the first control signal generation module, in one implementation, the line voltage compensation circuit includes: a first control signal generation module, a second control signal generation module and a line voltage generation module. Wherein the line voltage generation module regulates the baseline voltage to generate the line voltage compensation signal with different linear coefficients based on the first control signal and the second control signal respectively generated by the first control signal generation module and the second control signal generation module.

In some implementations, the first control signal generation module generates a first control signal based on a first reference voltage preset according to the change of signal reflecting bus voltage. The second control signal generation module generates a second control signal based on the change of the line voltage compensation signal. The line voltage generation module triggers corresponding voltage division circuit or shunt circuit under the control of the first control signal and the second control signal along with the change of the signal reflecting bus voltage, and then regulates the baseline voltage to obtain line voltage compensation signal which change in a segment-based linear manner. For example, the line voltage generation module segments voltage division compensation nodes of the line voltage compensation signal based on the first control signal, and the second control signal segments shunt nodes of the line voltage compensation signal.

It should be noted that, based on the reference voltage respectively set in the first control signal generation module and the second control signal generation module, the line voltage generation module can firstly perform linear adjustment on the baseline voltage to achieve the line voltage compensation signal based on the first control signal, and then perform linear adjustment on the baseline voltage to achieve the line voltage compensation signal based on the second control signal; or can firstly perform linear adjustment on the baseline voltage to achieve the line voltage compensation signal based on the second control signal, and then perform linear adjustment on the baseline voltage to achieve the line voltage compensation signal based on the first control signal.

Figure 10:
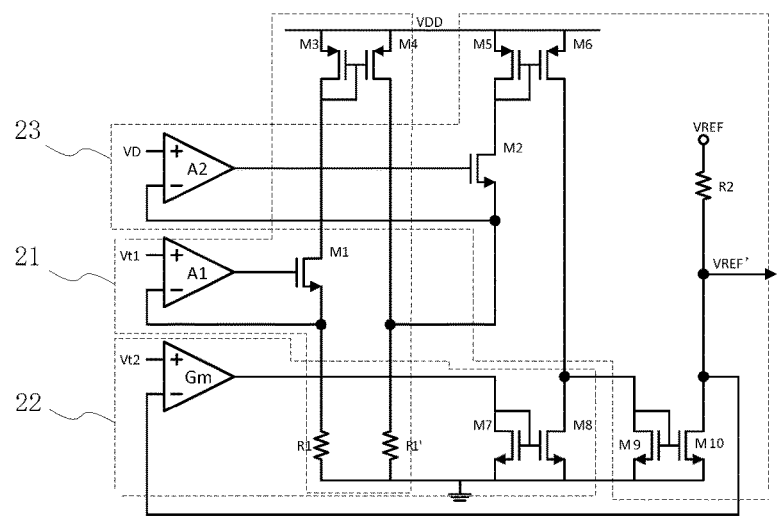
FIG. 10 is a circuit schematic diagram of the line voltage compensation circuit in the present application in one implementation.

In some specific examples, please refer to FIG. 10 which is a circuit schematic diagram of a line voltage compensation circuit in one implementation. The first control signal generation module 21 includes: a third current mirror (M3 and M4), a second switching device M1 and a second operational amplifier A1. The second control signal generation module 22 includes: a transconductance amplifier Gm and a fourth current mirror (M7 and M8). The line voltage generation module includes: a first operational amplifier A2, a first current mirror (M5 and M6), a second current mirror (M9 and M10) and a first switching device M2. Wherein a positive input terminal of the second operational amplifier A1 is connected with a generation circuit of the first reference voltage, a negative input terminal thereof is connected with a source of the second switching device M1, and an output terminal thereof is connected with a gate of the second switching device M1. A drain of the second switching device M1 is connected with a common gate of the third current mirror, and a source thereof is grounded via a second resistor R1. The third current mirror includes a pair of MOSFET (M3 and M4) with a common gate, drains of the pair of MOSFET (M3 and M4) are connected with a constant voltage source VDD together, and an output terminal of the third current mirror is connected with an input terminal of the line voltage generation module 23. A positive input terminal of the first operational amplifier A2 receives the signal reflecting bus voltage, a negative input terminal thereof receives the first control signal, and an output terminal thereof is connected with a gate of the first switching device M2. A drain of the first switching device M2 is connected with an input side of the first current mirror, and a source thereof is grounded via a first resistor R1. The first current mirror includes a pair of MOSFET (M5 and M6) with a common gate, drains of the pair of MOSFET (M5 and M6) are connected with a constant voltage source together, and an output terminal of the first current mirror is connected with an input terminal of the second current mirror. The second current mirror includes a pair of MOSFET (M9 and M10) with a common gate, drains of the pair of MOSFET (M9 and M10) are grounded together, and an output terminal of the second current mirror is connected with a baseline voltage source Vref via a resistor R2. Herein, the line voltage generation module changes the current flows through the resistor R2 connected between the baseline voltage generation circuit and the second current mirror, wherein the current flows through the resistor R2 varied with the current of the input terminal of the second current mirror, so that the line voltage compensation signal Vref output at the connection point between the line voltage generation module and one end of the resistor R2 and VD have segment-based linear compensation relationship.

Figure 11:
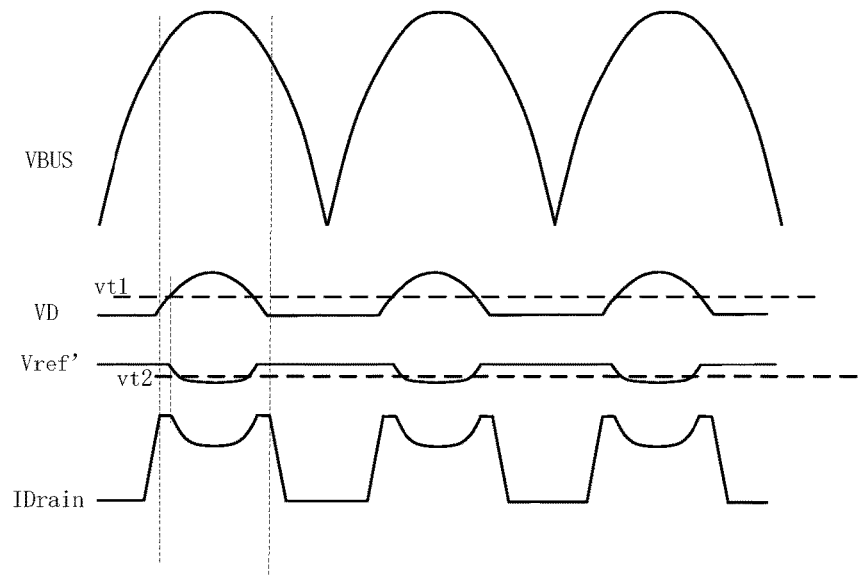
FIG. 11 is an waveform diagram of each circuit node varied with the VD voltage in the circuit as shown in FIG. 10.

Please refer to FIG. 11 which is a waveform diagram of each circuit node varied with the voltage of signal reflecting bus voltage VD in the circuit shown in FIG. 10. Wherein the first reference voltage vt1 is basically equal to the following voltage VR1 and is greater than the minimum value of VD, and the second reference voltage vt2 is smaller than the baseline voltage Vref. When VD gradually becomes larger from its minimum value, and in the period in which VD is smaller than vt1 and Vref' is greater than vt2, the voltage difference between the voltage of first control signal provided by the first control signal generation module and VD does not suffice to fall within the linear amplification interval of the first operational amplifier A2, and the first switching device M2 in the line voltage generation module is turned off; meanwhile, since the voltage at a negative input terminal of the transconductance amplifier Gm is greater than the voltage at a positive input terminal of the transconductance amplifier Gm, namely, the Vref' of line voltage compensation signal is greater than the second reference voltage vt2, based on the characteristics of the transconductance amplifier, the transconductance amplifier Gm outputs a negative current, and the fourth current mirror is enabled to be in a turn-off state, then the line voltage compensation signal output by the line voltage generation module is output based on the baseline voltage in the first linear relationship, namely, Vref'=Vref. When VD becomes larger continuously and is in a period in which VD is greater than or equal to vt1 and Vref' is greater than vt2, the voltage difference between the voltage of first control signal provided by the first control signal generation module and VD falls within the linear amplification interval of the first operational amplifier A2, meanwhile, the transconductance amplifier Gm still outputs the negative current, which enables the fourth current mirror to be still in a turn-off state, then the first switching device M2 in the line voltage generation module is turned on, the voltage difference amplified by the first operational amplifier A2 is output via the first current mirror and the second current mirror, and the line voltage compensation signal is output in the second linear relationship $V_{ref'}=(V_{ref}-V_{R2})$. When VD becomes larger continuously and is in a period in which VD is greater than vt1 and Vref' is smaller than or equal to vt2, the first operational amplifier A2 still amplifies the voltage difference between VD and the first control signal voltage, meanwhile, the transconductance amplifier Gm outputs a positive current (namely, the second control signal), such that the fourth current mirror is turned on and serves as a shunting device of the second current mirror. In this way, the current at the output terminal of the second current mirror declines in a lower speed, and Vref' continuously declines in a third linear relationship along with the rise of the VD voltage since Vref' is smaller than vt2. When VD gradually becomes smaller from its maximum value, the line voltage compensation signal gradually raise Vref' of the line voltage compensation signal in a sequence from the third linear relationship, the second linear relationship to the first linear relationship, such that in a valid power supply period in which bus supplies power, the bus current forms an IDrain current waveform as shown in FIG. 11 after linear feedback. Here, the first reference voltage vt1 and the second reference voltage vt2 may be set based on the electrical characteristics of the operational amplifier A1 and the transconductance Gm, and the voltage range of the signal reflecting the bus voltage. Therefore, it can be seen that in an instant duration in the valid power supply region of bus and close to the invalid power supply region, the change of the current flowing through a load is gentler than that in single linear compensation, and in the period in the valid power supply region of bus and close to a voltage peak, the change of the current flowing through a load is gentler than that in single linear compensation.

Based on the examples of each line voltage compensation circuit, the line voltage compensation circuit can also provide other control signal generation modules based on the change of the voltage of the signal reflecting bus voltage or based on the change of the line voltage compensation signal, so as to provide more segment-based linear adjustment to the line voltage compensation signal, such that the line voltage compensation signal is more fit to the waveform change of the bus.

In some implementations, the line voltage compensation circuit further includes a third control signal generation module which is electrically connected between the line voltage generation module and the second control signal generation module. The third control signal generation module is configured to receive the third reference voltage and the line voltage compensation signal, and to cut off the current path through which the current flows from the line voltage generation module to the second control signal generation module when the line voltage compensation signal is smaller than or equal to the third reference voltage. Herein, the third control signal generation module is configured to adjust the peak region of the bus voltage by utilizing the generated linear relationship.

In some specific examples, the third control signal generation module includes: a third operational amplifier A3 and a third switching device M11. Wherein a negative input terminal of the third operational amplifier A3 is configured to receive the third reference voltage, and a positive input terminal thereof is connected with a second control signal generation module; and the third switching device M11 is electrically connected with an output terminal of the line voltage generation module and an output terminal of the third operational amplifier A3.

Figure 12:
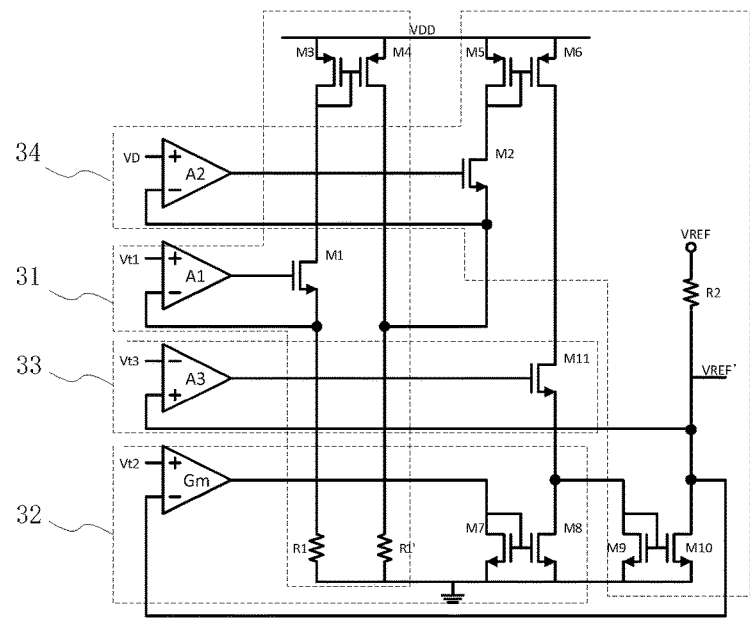
FIG. 12 is a structural schematic diagram of the line voltage compensation circuit in the present application in another implementation.

For example, please refer to FIG. 12 which is a structural schematic diagram of the line voltage compensation circuit including a first control signal generation module 31, a second control signal generation module 32, a third control signal generation module 33 and a line voltage generation module 34. Wherein a positive input terminal of the second operational amplifier A1 is connected with a generation circuit of the first reference voltage, a negative input terminal thereof is connected with a source of the second switching device (M1), and an output terminal thereof is connected with a gate of the second switching device M1. A drain of the second switching device M1 is connected with a common gate of the third current mirror, and a source thereof is grounded via a second resistor R1. The third current mirror includes a pair of MOSFET (M3 and M4) with a common gate, drains of the pair of MOSFET (M3 and M4) are connected with a constant power source VDD together, and an output terminal of the third current mirror is connected with an input terminal of the line voltage generation module. A positive input terminal of the first operational amplifier A2 receives the signal reflecting bus voltage, a negative input terminal thereof receives the first control signal, and an output terminal thereof is connected with a gate of the first switching device M2. A drain of the first switching device M2 is connected with an input side of the first current mirror, and a source thereof is grounded via a first resistor R1. The first current mirror includes a pair of MOSFET (M5 and M6) with a common gate, drains of the pair of MOSFET (M5 and M6) are connected with a constant voltage source together, and an output terminal of the first current mirror is connected with an input terminal of the second current mirror. The second current mirror includes a pair of MOSFET (M9 and M10) with a common gate, drains of the pair of MOSFET (M9 and M10) are grounded together, and an output terminal of the second current mirror is connected with a baseline voltage source Vref via a resistor R2. A negative input terminal of a third operational amplifier A3 is configured to receive the third reference voltage vt3, and a positive input terminal thereof and the transconductance amplifier Gm together receive the Vref' of line voltage compensation signal. A drain of the third switching device M11 is connected with a terminal to which the second current mirror and the fourth current mirror (M7 and M8) are connected, and a gate thereof is connected with an output terminal of the third operational amplifier M11. An output terminal of the second current mirror serves as an output terminal of the line voltage generation module to output Vref' of line voltage compensation signal based on the baseline voltage. In view of the baseline voltage Vref is provided by a constant voltage source, and provided to the line voltage generation module via a Resistor R2, the line voltage generation module can adjust the current flows through R2, and the line voltage generation module can output the linear voltage compensation signal Vref'.

Figure 13:
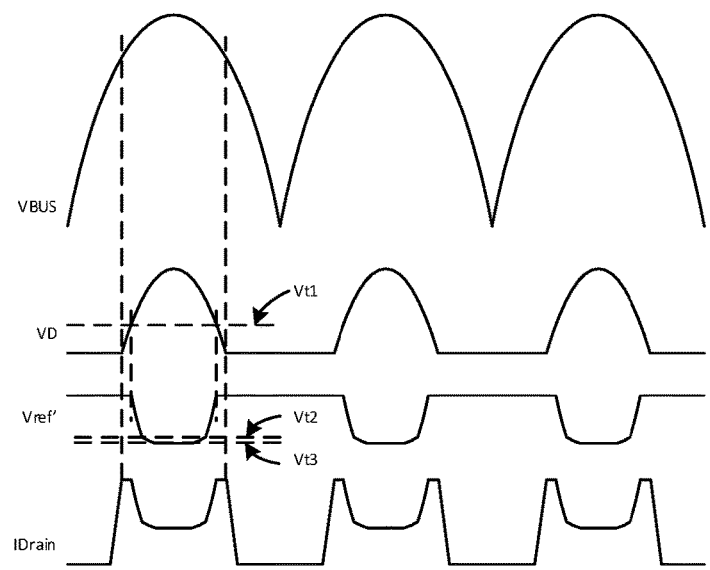
FIG. 13 is an waveform diagram of each circuit node varied with the VD voltage in the circuit as shown in FIG. 12.

Please refer to FIG. 13 which is a waveform diagram of each circuit node varied with the signal VD reflecting bus voltage in the circuit shown in FIG. 12. Wherein the first reference voltage vt1 is basically equal to the following voltage VR1 and is greater than the minimum value of VD, and the second reference voltage vt2 is smaller than the baseline voltage Vref. When VD gradually becomes larger from its minimum value, and in the period in which VD is smaller than vt1 and Vref' is greater than vt2 and vt2 is greater than vt3, the voltage difference between the voltage of first control signal provided by the first control signal generation module and VD does not suffice to fall within the linear amplification interval of the first operational amplifier A2, and the first switching device M2 in the line voltage generation module is turned off; meanwhile, since the voltage at a negative input terminal of the transconductance amplifier Gm is greater than the voltage at a positive input terminal of the transconductance amplifier Gm, namely, the Vref' of line voltage compensation signal is greater than the second reference voltage vt2, the transconductance amplifier Gm outputs a negative current, and the fourth current mirror is enabled to be in a turned-off state, and the third operational amplifier A3 controls the third switching device M11 to be in a turn-on state, then the line voltage compensation signal output by the line voltage generation module is output in the first linear relationship, namely, Vref'=Vref. When VD becomes larger continuously and is in a period in which VD is greater than or equal to vt1 and Vref' is greater than vt2, the voltage difference between the voltage of first control signal provided by the first control signal generation module and VD falls within the linear amplification interval of the first operational amplifier A2, the first switching device M2 in the line voltage generation module is turned on, meanwhile, the transconductance amplifier Gm still outputs the negative current, the fourth current mirror is turned off, and the third operational amplifier A3 controls the third switching device M11 to be still in a turn-on state, then the voltage difference amplified by the first operational amplifier A2 of the line voltage generation module is output via the first current mirror and the second current mirror, and the line voltage compensation signal is output in a second linear relationship, namely, $V_{ref'}=(V_{ref}-V_{R2})$ When VD becomes larger continuously and is in a period in which VD is greater than vt1 and Vref' is smaller than or equal to vt2, the first operational amplifier A2 still amplifies the voltage difference between VD and the first control signal voltage, meanwhile, the transconductance amplifier Gm outputs a positive current (namely, the second control signal), such that the fourth current mirror is turned on and serves as a shunting device of the second current mirror. In this way, the current at the output terminal of the second current mirror declines in a lower speed, and Vref' continuously declines in a third linear relationship along with the rise of the VD voltage since Vref' is smaller than vt2. When Vref' declines to be smaller than vt3, the third switching device M11 is turned off, such that Vref' is clamped in the fourth linear relationship, namely, a constant voltage. When VD gradually becomes smaller from its maximum value, the voltage of the line voltage compensation signal Vref' gradually rises in a sequence from the fourth linear relationship, the third linear relationship, the second linear relationship to the first linear relationship, such that in a valid power supply period in which bus supplies power, the current on a load forms an IDrain current waveform as shown in FIG. 13 after linear feedback. Here, reference voltages vt1, vt2, and vt3 may be set based on the electrical characteristics of the operational amplifiers A1, A2 and the transconductance Gm, and the voltage range of the signal reflecting the bus voltage, respectively. Therefore, it can be seen that in an instant duration in the valid power supply region and close to the invalid power supply region on a load, the change of the current flowing through a load is gentler than that in single linear compensation, and in the period in the valid power supply region on a load and close to a voltage peak, the change of the current flowing through a load is gentler than that in single linear compensation.

Each reference voltage and baseline voltage mentioned in the line voltage compensation circuit can all be provided by a baseline voltage generation circuit. The baseline voltage generation circuit can be a constant voltage source which is dedicated to supply each reference voltage and baseline voltage in the line voltage compensation circuit; and can also be shared with constant voltage source in the driver in which the line voltage compensation circuit is located. For example, the baseline voltage generation circuit is a circuit that a shared constant voltage source generates each reference voltage and baseline voltage after being voltage divided via multiple resistor divider.

The present application further provides a driver. The driver includes any of the above line voltage compensation circuit and the drive circuit. The Driver includes the line voltage compensation circuit 41 and drive unit 42. The line voltage compensation circuit 41 is configured to receive signal reflecting bus voltage and output line voltage compensation signal based on the received signal reflecting bus voltage, a preset baseline voltage and at least one reference voltage, wherein the line voltage compensation signal has a multi-segment linear relationship with the received signal reflecting bus voltage. The drive unit 42 is connected with the line voltage compensation circuit and a load, and is configured to drive the load based on the received line voltage compensation signal and a following voltage of the load. The driver is used on a load driving device which needs to be subjected to multi-segment compensation via the line voltage compensation circuit. The driver can be encapsulated in a chip or can be encapsulated on a PCB. Wherein the drive circuit is connected with a line voltage compensation circuit and a load, and is configured to couple the received line voltage compensation signal with the following voltage of the load to drive the load.

Figure 14:
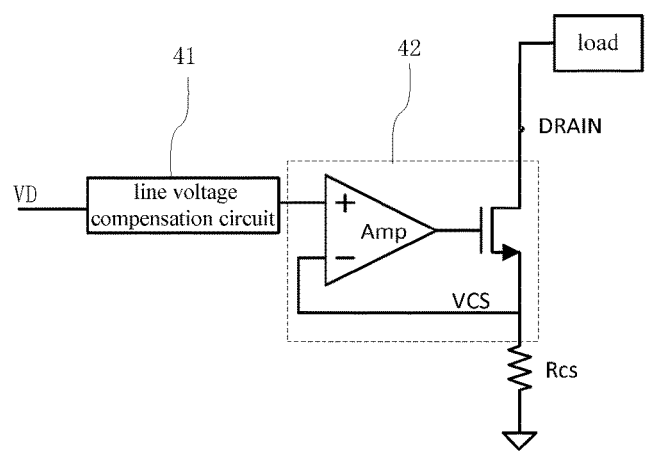
FIG. 14 is a structural schematic diagram of the driver in the present application in one implementation.

Please refer to FIG. 14 which is a structural schematic diagram of a driver in one implementation. An output terminal of the line voltage compensation circuit 41 is connected with a positive input terminal of the operational amplifier Amp in the drive unit 42, an output terminal of the Amp is connected with a gate of a power device included in the drive unit 42, a drain of the power device is connected with a load, and a source thereof is grounded via a sampling unit. A negative input terminal of the operational amplifier Amp is connected with the sampling unit to acquire a sampling voltage, which indicating the current flows through the road. Wherein the operational amplifier Amp amplifies the voltage difference between the Vref of line voltage compensation signal and the voltage Vcs acquired by the sampling unit, so as to drive the power device. In some embodiments, the sampling unit can include a resistor Rcs as shown in FIG. 14.

The present application further provides an LED drive circuit which is dedicated to an LED load. The LED drive circuit is set in a drive system of an LED lamp and can be encapsulated in a chip or integrated on a PCB. The LED drive circuit includes any of the above line voltage compensation circuit or the drive circuit. The drive circuit is also described as the above driver.

Figure 15:
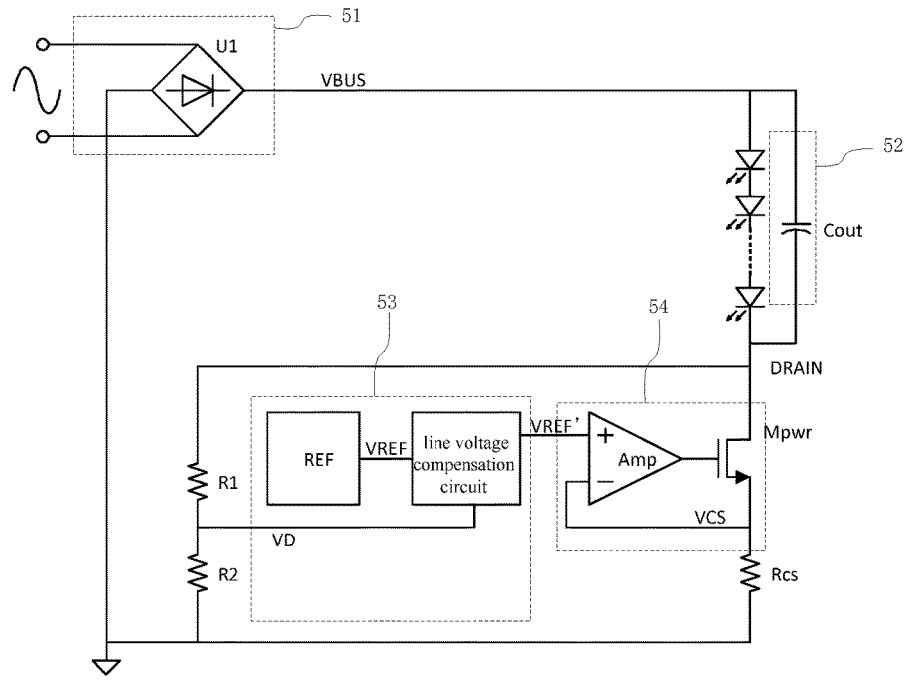
FIG. 15 is a structural schematic diagram of the LED drive system in the present application in one implementation.

In order to drive an LED load, as shown in FIG. 15, the LED drive system in the present application includes: a rectifying unit 51, an energy storage unit 52, a line voltage compensation circuit 53 and a drive unit 54.

The rectifying unit 51 is configured to rectify the current input by an external AC source and output the rectified current to an LED load. Wherein the current input by an external AC source can be alternating current utility power supply. The rectifying unit 51 is connected with an external AC through connecting with an AC input terminal (such as a socket and a connector) which is connected to alternating current utility power supply. The rectifying unit 51 performs full-wave rectification on the current input by an external AC to form a bus voltage VBUS waveform as shown in FIGS. 8, 9, 11 and 13, and then outputs to the LED load. Wherein the rectifying unit 51 can include a rectifier bridge constituted by four diodes to perform full-wave rectification.

The energy storage unit 52 is connected with an input terminal and an output terminal of the LED load and is configured to perform lowpass filtering on the LED load. The energy storage unit 52 includes a capacitor which is connected with the LED load in parallel.

The line voltage compensation circuit 53 is connected with the LED load, and is configured to acquire bus voltage from the bus which the load is located or signal reflecting bus voltage, and configured to generate a line voltage compensation signal has a multi-segment linear relationship with the received signal reflecting bus voltage. The line voltage compensation circuit 53 can acquire the signal reflecting bus voltage through a voltage division unit. Wherein the voltage division unit, such as includes R1 and R2 located in FIG. 15, is connected with an output terminal of the LED load and the line voltage compensation circuit, and is configured to generate the signal reflecting bus voltage based on the voltage of a terminal of the LED load and then output to the line voltage compensation circuit. The line voltage compensation circuit 53 can regulates the baseline voltage to generate the line voltage compensation signal based on the change of the acquired signal VD reflecting bus voltage, and the structure of the line voltage compensation circuit is as shown in FIGS. 5, 6, 7, 10 and 12.

The drive unit 54 is connected with the line voltage compensation circuit 53 and the LED load, and is configured to couple the received line voltage compensation signal with the sampled signal to drive the LED load. Wherein the drive unit 54 includes an operational amplifier Amp and a power device as shown in FIG. 14. An output terminal of the line voltage compensation circuit 53 is connected with a positive input terminal of the operational amplifier Amp, an output terminal of the Amp is connected with a gate of the power device, a drain of the power device is connected with a load, and a source thereof is grounded via a sampling unit. In some embodiment, the sampling unit can include the sampling resistor Rcs. A negative input terminal of the operational amplifier Amp is connected with the sampling unit to acquire the sampling signal. Wherein the operational amplifier Amp amplifies the voltage difference between the Vref of line voltage compensation signal and the voltage Vcs of sampling signal sampled by the sampling resistor Rcs so as to drive the power device.

The LED drive system further provides a dimming function. Please refer to FIG. 16 which is a structural schematic diagram of the LED drive system in one implementation. Different from the above implementations, the LED drive system further includes a dimming unit 55 which is connected between an input terminal of external AC and the rectifying unit 51. The dimming unit 55 is configured to controllably adjust the bus voltage so as to correspondingly adjust the brightness of the LED load. Herein, the dimming unit 55 adjusts the waveform of the AC voltage input into the rectifying unit 51, such that the voltage waveform which is subjected to rectification via the rectifying unit 51 is as shown by any VBUS in FIGS. 17 and 18. Wherein FIG. 17 is a voltage waveform diagram after forward phase dimming by a dimming unit and after rectification by a rectifying unit, wherein forward phase dimming refers to that voltage chopping begins to be input from the AC phase 0 until the triac is turned on, power supply is output to the rectifying unit. FIG. 18 is a voltage waveform diagram after rearward phase dimming by a dimming unit and after rectification by a rectifying unit, wherein rearward phase dimming refers to that voltage chopping begins to be input from a preset AC phase until the phase reaches 180° so that the triac is turned on, power supply is output to the rectifying unit.

The dimming unit 55 includes a dimming instruction generation module and a triac dimmer. Wherein the dimming instruction generation module outputs corresponding dimming instructions to the triac dimmer based on user's operation. In some examples, the dimming instruction generation module includes a human-machine interaction interface, when users operate the human-machine interaction interface, corresponding brightened or dimmed instructions are generated, and the dimming instruction generation module converts the instructions into dimming instructions in match with the triac dimmer and outputs to the triac dimmer. The triac dimmer adjusts the AC phase at which the triac is turned on or turned off based on the received dimming instructions. For example, if the triac dimmer is a front cut triac dimmer, the front cut triac dimmer controls the AC phase at which the triac is turned on based on the received dimming instructions. For another example, if the triac dimmer is rear cut triac dimmer, the rear cut triac dimmer controls the AC phase at which the triac is turned off based on the received dimming instructions.

Figure 16:
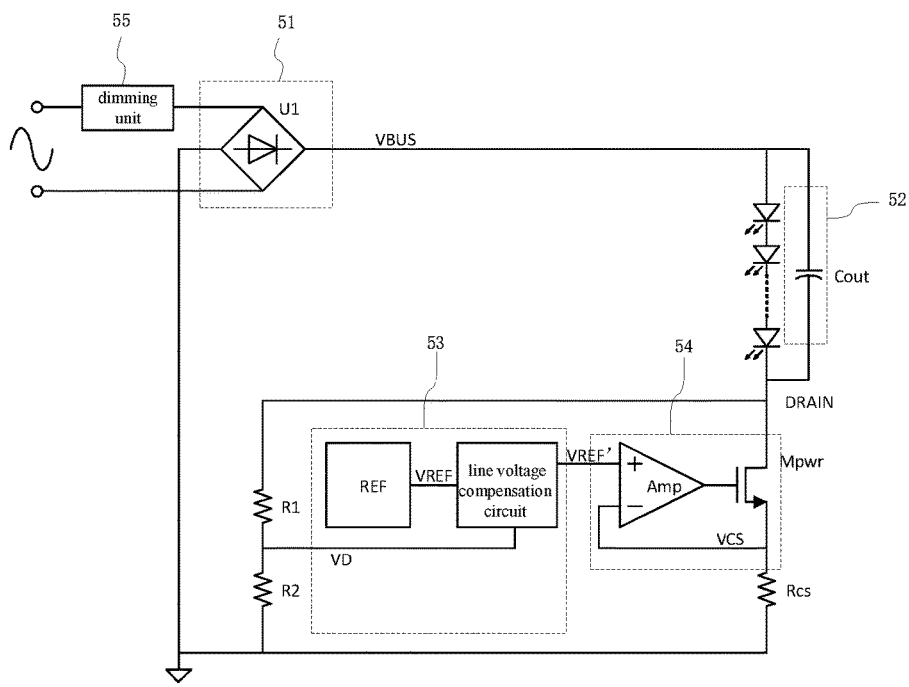
FIG. 16 is a structural schematic diagram of the LED drive system in the present application in another implementation.
Figure 17:
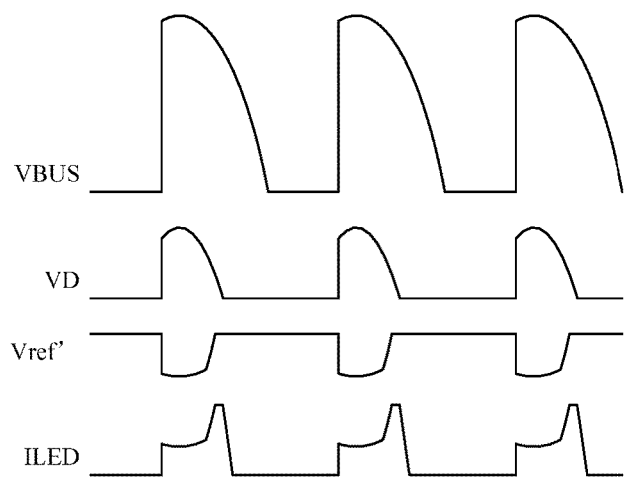
FIG. 17 is a waveform diagram of a bus voltage VBUS adjusted by a forward phase dimmer, a line voltage compensation circuit input signal VD, a reference voltage Vref' output by a line voltage compensation circuit included in the LED drive system and a current ILED of an LED load of the present application.
Figure 18:
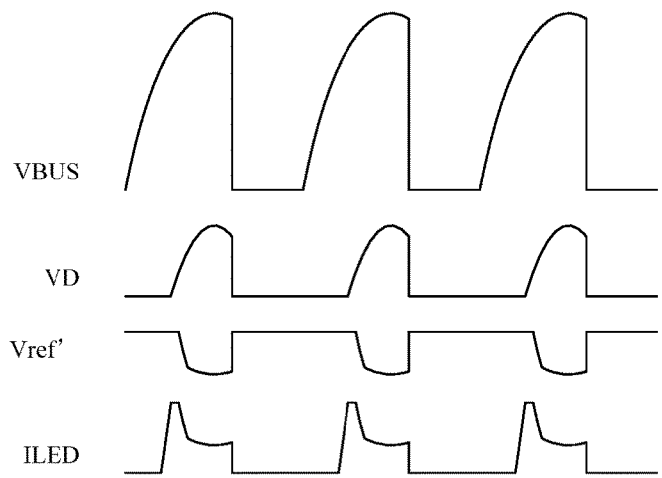
FIG. 18 is a waveform diagram of a bus voltage VBUS adjusted by a rearward phase dimmer, a line voltage compensation circuit input signal VD, a reference voltage Vref' output by a line voltage compensation circuit included in the LED drive system and a current ILED of an LED load of the present application.

With the combination of FIGS. 16 and 17 as an example, when AC source is processed by the dimming unit 55 which includes the front cut triac dimmer and by the rectifying unit 51 to acquire the waveform of bus voltage VBUS as shown in FIG. 17, the waveform of the signal reflecting bus voltage VBUS and received by the line voltage compensation circuit 53 is as shown by VD in FIG. 17; the line voltage compensation circuit 53 outputs line voltage compensation signal which have a multi-segment linear relationship with the signal VD reflecting bus voltage based on the signal VD reflecting bus voltage, a preset baseline voltage and at least one reference voltage, wherein the line voltage compensation signal is as shown by Vref' in FIG. 17; the current flowing through the LED load forms the waveform current as shown by ILED in FIG. 17 after being subjected to compensation by the line voltage compensation circuit. During the process period in which the dimming unit 55 is brightened to its brightest state based on user's operation, a front cut triac dimmer in the dimming unit 55 adjusts the AC phase at which the triac is turned on towards a phase direction of close to 0°, and the waveform of corresponding bus voltage VBUS gradually tends to be the VBUS waveform as shown in any of FIGS. 8, 9, 11 and 13; correspondingly, the waveform of the current flowing through an LED load and being subjected to compensation by the line voltage compensation circuit 53 gradually tends to become the IDRAIN waveform as shown in any of FIGS. 8, 9, 11 and 13 from an ILED waveform as shown in FIG. 17. When the dimming unit 55 is dimmed based on user operation until the light is extinguished, the change tendency of each waveform is opposite to that in the brightening process and will not be repeated in detail herein.

With the combination of FIG. 16 and FIG. 18 as an example, when AC is processed by the dimming unit 55 which includes a rear cut triac dimmer and by the rectifying unit 51 to acquire a waveform of the bus voltage VBUS as shown in FIG. 18, the waveform of the signal reflecting bus voltage VBUS and received by the line voltage compensation circuit 53 is as shown by VD in FIG. 18; the line voltage compensation circuit 53 outputs line voltage compensation signal which have a multi-segment linear relationship with the signal VD reflecting bus voltage based on the signal VD reflecting bus voltage, a preset baseline voltage and at least one reference voltage, wherein the line voltage compensation signal is as shown by Vref' in FIG. 18; the current flowing through an LED load forms the waveform current as shown by ILED in FIG. 18 after being subjected to compensation by the line voltage compensation circuit 53. During the process period in which the dimming unit 55 is dimmed to its brightest state based on user operation, a rear cut triac dimmer in the dimming unit 55 adjusts a AC phase at which the triac is turned off towards a phase direction of close to 180°, and the waveform of the corresponding bus voltage VBUS gradually tends to be the VBUS waveform as shown in any of FIGS. 8, 9, 11 and 13; correspondingly, the waveform of the current flowing through an LED load and being subjected to compensation by the line voltage compensation circuit 53 gradually tends to become the IDRAIN waveform as shown in any of FIGS. 8, 9, 11 and 13 from an ILED waveform as shown in FIG. 18. When the dimming unit 55 is dimmed based on user operation until the light is extinguished, the change tendency of each waveform is opposite to that in the brightening process and will not be repeated in detail herein.

Figure 19:
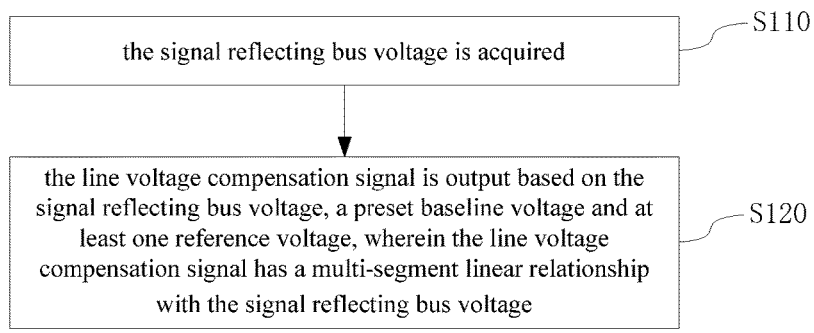
FIG. 19 is a flow chart of a line voltage compensation method in the present application in one implementation.

Please refer to FIG. 19 which is a flow chart of a line voltage compensation method in the present application. The line voltage compensation method is mainly implemented by any of the above line voltage compensation circuits, or by other circuits, integrated circuits and the like which can implement the compensation method.

In step S110, the signal reflecting bus voltage is acquired.

Herein, the signal reflecting bus voltage can be directly acquired from the bus circuit or load circuit which supplies power to the load. For example, the power supply line is connected with a sampling resistor, and the line voltage compensation circuit acquires the signal reflecting bus voltage from the output terminal of the sampling resistor. In some implementations, the signal reflecting bus voltage are generated by a voltage division unit based on the detected bus voltage or a voltage of a terminal of a load. Wherein the voltage division unit can be a resistor string which is connected between a bus circuit and the ground, or the voltage division unit can be a resistor string which is connected between a load circuit and the ground. The grounded resistor string is utilized to divide a branch circuit reflecting the change of current and voltage on the bus circuit from power supply line which supplies power to the load, and the line voltage compensation circuit acquires signal reflecting bus voltage from the branch circuit. For example, please refer to FIG. 4 which is a circuit schematic diagram showing the connection between the line voltage compensation circuit 12 and a load circuit via a voltage division unit 11. Wherein, the voltage division unit 11 is connected between drain (DRAIN side) of power tube (MOSFET) and the ground. The load circuit is connected with a drive circuit 13, a load connected in series with the drive circuit 13 and other peripheral circuits. Wherein, when the bus voltage (such as VBUS) reaches the voltage which enables the load to operate, the bus circuit loop is turned on, and the drive circuit 13 enables the load to operate, and when the bus voltage (such as VBUS) cannot reach the voltage which enables the load to operate, the bus circuit loop is turned off. Wherein the drive circuit in FIG. 4 includes a power device, and the power device can be a MOSFET and the like. The voltage division unit is connected with a drain (DRAIN side) of the power device, and the linear compensation circuit 12 acquires the signal VD reflecting bus voltage from a resistor side of the voltage division unit 11.

In step S120, the line voltage compensation signal is output based on the signal reflecting bus voltage, a preset baseline voltage and at least one reference voltage, wherein the line voltage compensation signal has a multi-segment linear relationship with the signal reflecting bus voltage.

The baseline voltage is directly supplied by a constant voltage source (also called baseline voltage generation circuit) or is supplied after voltage division based on the voltage provided by the constant voltage source. The constant voltage source can be dedicated to the line voltage compensation circuit, and can also be shared with other constant voltage sources in the chip in which the line voltage compensation circuit is located. In some embodiments, the baseline voltage is provided to the line voltage compensation circuit via a resistor, and grounded. The linear compensation circuit can adjust the current follows through the resistor, so as the linear compensation signal is output at the connection node between the voltage compensation circuit and the resistor which varied with the adjusted current correspondingly.

As a segment-based node voltage which performs linear compensation on the bus voltage, the reference voltage is a constant voltage supplied by a constant voltage source. Based on the design requirements of a line voltage compensation circuit, the reference voltage can serve as a segment-based node voltage that line voltage compensation circuit performs segment-based compensation based on the change of signal reflecting bus voltage. For example, the line voltage compensation circuit compares the reference voltage with voltage of the signal reflecting bus voltage, and selects a line voltage compensation path based on the comparative results to output the line voltage compensation signal, such that corresponding to different comparative results, the line voltage compensation signal has different linear relationships with the signal reflecting bus voltage. The reference voltage can also serve as a segment-based node voltage that line voltage compensation circuit performs segment-based compensation based on the change of the line voltage compensation signal. For example, the line voltage compensation circuit compares the reference voltage with the voltage of the line voltage compensation signal, wherein the line voltage compensation signal is acquired through performing linear compensation on bus voltage based on the signal reflecting bus voltage; based on the comparative results, a line voltage compensation path is selected to output line voltage compensation signal, such that corresponding to different comparative results, the line voltage compensation signal has different linear relationships with the signal reflecting bus voltage. In consideration of cost and user experience sensitivity, one reference voltage or two reference voltage is considered. For example, the reference voltage only includes one voltage value v1, the reference voltage v1 serves as a segment-based node voltage of linear compensation, the line voltage compensation circuit supplies line voltage compensation signal with the first linear relationship between the baseline voltage Vref and v1, and supplies line voltage compensation signal with the second linear relationship between voltage v1 and a grounded voltage. For another example, the reference voltage includes voltage values v1 and v2, wherein v1 is greater than v2, the reference voltages v1 and v2 serve as the segment-based node voltage of linear compensation, the line voltage compensation circuit supplies line voltage compensation signal with the first linear relationship between the baseline voltage Vref and v1, supplies line voltage compensation signal with the second linear relationship between voltage v1 and v2, and supplies line voltage compensation signal with the third linear relationship between voltage v2 and a grounded voltage. In order to make a more detailed division of the linear relationship between the line voltage compensation signal and the received signal reflecting bus voltage, such that multi-segment linear compensation is more fit to the changing of line voltage, more reference voltages can be set in the line voltage compensation circuit in a sequence from big to small.

It should be noted that, each linear relationship should be understood in a broad sense. The linear relationship includes the linear relationship with a nonzero linear coefficient between the voltage of the line voltage compensation signal and the received signal reflecting bus voltage, or the linear relationship with zero linear coefficient between the voltage of the line voltage compensation signal and the received signal reflecting bus voltage.

In one implementation, step S120 further includes the following step:

when comparing the signal reflecting bus voltage and a first reference voltage, a first control signal is output based on the compared results; and the line voltage compensation signal is output based on the signal reflecting bus voltage, the first control signal and the baseline voltage.

Specifically, the line voltage compensation circuit includes a first control signal generation module and a line voltage generation module. Wherein the first control signal generation module receives a first reference voltage, and outputs the first control signal based on the first reference voltage. Wherein the first reference voltage belongs to one of the above reference voltages. The line voltage generation module is electrically connected with the first control signal generation module and is configured to receive the signal reflecting bus voltage, the first control signal and the baseline voltage and generate the line voltage compensation signal based on the received signal reflecting bus voltage, the first control signal and the baseline voltage.

Please refer to FIG. 5 which is a schematic diagram of a circuit structure of the first control signal generation module in one implementation, wherein the first reference voltage received by the first control signal generation module is a reference voltage set based on the change of signal reflecting bus voltage. The first control signal generation module includes: a third current mirror, a second switching element M1 and a second operational amplifier A1. Wherein the third current mirror includes a pair of MOSFET (M3 and M4) with a common gate, drains of the pair of MOSFET (M3 and M4) are connected with a constant voltage source VDD together, and an output terminal of the third current mirror is connected with the line voltage generation module. A drain of the second switching device M1 is connected with the common gate of the third current mirror, and a source thereof is grounded via a second resistor R1. A positive input terminal of the second operational amplifier A1 is connected with a generation circuit of a first reference voltage, a negative input terminal thereof is connected with a source of the second switching device M1, and an output terminal thereof is connected with a gate of the second switching device M1. Wherein in order to output the first control signal generated based on the first reference voltage, the second switching device M1 needs to be in a normally turn-on state, and by utilizing the second resistor R1 connected with the input terminal of the third current mirror, the third current mirror transmits the first reference voltage to the output terminal of the third current mirror, and the output terminal of the third current mirror then outputs the first control signal corresponding to the first reference voltage vt1 based on the connected resistor R1'. Wherein under the influence of the resistance of the resistors R1 and R1', the first control signal voltage can be equal to the first reference voltage vt1 or can be obtained by performing voltage division on the first reference voltage vt1. The first control signal is output to the line voltage generation module. The line voltage generation module receives the signal VD reflecting bus voltage, and compares the voltage of signal reflecting bus voltage VD with the first control signal voltage, when the voltage of signal reflecting bus voltage VD falls within an amplification interval set based on the first control signal voltage, a linear compensation signal is generated and output, and when the voltage of signal reflecting bus voltage VD does not fall within the amplification interval set based on the first control signal voltage, another linear compensation signal is generated and output.

In another implementation, step S120 further includes the following step:

the line voltage compensation signal is output based on the compared result between a fed-back line voltage compensation signal and preset at least one reference voltage, the signal reflecting bus voltage and the fed-back line voltage compensation signal.

Please refer to FIG. 6 which is a schematic diagram of a circuit structure of the first control signal generation module in another implementation, wherein the first reference voltage received by the first control signal generation module is a reference voltage value set based on the change of the line voltage compensation signal. The first control signal generation module includes: a transconductance amplifier Gm and a fourth current mirror. A positive input terminal of the transconductance amplifier Gm is connected with a generation circuit of a first reference voltage, and a negative input terminal thereof is connected with an output terminal of the line voltage generation module. The fourth current mirror includes a pair of MOSFET (M7 and M8) with a common gate, drains of the pair of MOSFET (M7 and M8) are grounded together, an input terminal of the fourth current mirror is connected with an output terminal of the transconductance amplifier, and an output terminal thereof is connected with the input terminal of the line voltage generation module. Wherein the generation circuit of the first reference voltage can include a constant voltage source, and can even include a resistor divider connected with the constant voltage source. The transconductance amplifier Gm performs amplification and integration treatment on an error between the obtained Vref' of line voltage compensation signal output by the line voltage generation module and the first reference voltage vt2, so as to obtain a first control signal reflecting an average of the voltage of the line voltage compensation signal. The line voltage compensation circuit output the line voltage compensation signal Vref by adjusting the current flows through the resistor R2 connected with the baseline voltage generation circuit. One terminal of the resistor R2 can access a baseline voltage Vref, while the other terminal is connected with the output terminal of the line voltage generation module. The first control signal is transmitted to the input terminal of the line voltage generation module via the fourth current mirror (M7 and M8). The line voltage generation module receives the signal reflecting bus voltage and compares the voltage of the signal reflecting bus voltage with the first control signal voltage, when the voltage of signal reflecting bus voltage VD falls within an amplification interval set based on the first control signal voltage, a linear compensation signal is generated and output, and when the voltage of signal reflecting bus voltage VD does not fall within the amplification interval set based on the first control signal voltage, another linear compensation signal is generated and output.

Please refer to FIG. 7 which is a schematic diagram of a circuit structural of the line voltage generation module. The line voltage generation module includes: a first current mirror, a first switching device M2, a first operational amplifier A2 and a second current mirror. Wherein the first current mirror includes a pair of MOSFET (M5 and M6) with a common gate, and drains of the pair of MOSFET (M5 and M6) are connected with a constant voltage source together. A drain of the first switching device M2 is connected with an input side of the first current mirror, and a source thereof is grounded via a first resistor R1. A positive input terminal of the first operational amplifier A2 receives the signal reflecting bus voltage, a negative input terminal thereof receives the first control signal, and an output terminal thereof is connected with a gate of the first switching device M2. The second current mirror includes a pair of MOSFET (M9 and M10) with a common gate, drains of the pair of MOSFET (M9 and M10) are grounded together, input terminals thereof are connected with the output terminal of the first current mirror, and output terminals thereof output line voltage compensation signal which are adjusted based on the voltage signal output by the first operational amplifier A2 and generated based on the baseline voltage. In FIG. 7, the output terminal of the second current mirror is further connected with the baseline voltage source Vref via the resistor R2, the voltage signal output by the first operational amplifier A2 are transmitted to the second current mirror, and the voltage of the line voltage compensation signal Vref' output by the second current mirror is represented as follows: $V_{ref'}=(V_{ref}-V_{R2})$, wherein $V_{R2}$ is a voltage drop reflecting on the resistor R2 based on the change of the current output by the second current mirror. In view of the baseline voltage Vref is the voltage provided by a constant voltage source, the line voltage generation module can adjust the current follows through R2, and the line voltage generation module can output the linear compensation signal at the connection node between the line voltage generation module and R2.

In some other implementations, step S120 further includes the following steps:

comparing the signal reflecting bus voltage and a preset first reference voltage, outputting a first control signal based on the compared results; and outputting the line voltage compensation signal based on the signal reflecting bus voltage, the first control signal and the baseline voltage;

when detecting that a fed-back line voltage compensation signal is smaller than or equal to a preset second reference voltage, outputting the line voltage compensation signal based on the signal reflecting bus voltage, the first control signal, the second reference voltage and the baseline voltage; wherein the second reference voltage is smaller than the first reference voltage.

Please refer to FIG. 8 and FIG. 21. FIG. 21 is a structural schematic diagram of the line voltage compensation circuit obtained in combination with FIG. 5 and FIG. 7. FIG. 8 is a waveform diagram showing that the circuit in FIG. 21 supplies line voltage compensation signal correspondingly along with the change of the acquired signal reflecting bus voltage. As shown in FIG. 21, due to the negative feedback of the second operational amplifier A1, as a buffer, the second operational amplifier A1 makes the first reference voltage vt1 basically equal to the following voltage VR1. Meanwhile, the first control signal is output to the line voltage generation module, specifically, the first reference voltage vt1 is transmitted to the input terminals of the first current mirrors M5 and M6 (i.e., input terminals of M5 and M6 in FIG. 7) via the third current mirrors M3 and M4 (i.e., output terminals of M3 and M4 in FIG. 5). Based on the connection relationship between input terminals of the first operational amplifier A2, the negative input terminal of the first operational amplifier A2 receives an feedback signal, the feedback signal varied with the first control signal output by the third current mirrors (M3 and M4) included in first control signal generation module and the signal output by the first operational amplifier A2. In order to make VD fall within an amplification interval set based on the first control signal, the first control signal is greater than the minimum value of VD. Resistor R1 connected with the input terminal of the first current mirror in FIG. 7 or Resistor R1' connected with the output terminal of the third current mirror in FIG. 5 corresponds to R1' in FIG. 21. When VD gradually becomes larger from its minimum value, and in the period in which VD is smaller than vt1, the voltage difference between the voltage of first control signal provided by the first control signal generation module and the received signal VD does not suffice to fall within the linear amplification interval of the first operational amplifier A2, then the first switching device M2 in the line voltage generation module is turned off, the line voltage generation module does not output voltage signal, then the Vref' of line voltage compensation signal is equal to Vref. In the period in which VD is greater than or equal to vt1, the voltage difference between the voltage of first control signal provided by the first control signal generation module and the received signal VD falls within the linear amplification interval of the first operational amplifier A2, then the first switching device M2 in the line voltage generation module is turned on, the voltage difference amplified by the first operational amplifier A2 is output via the first current mirror and the second current mirror, then the Vref' of line voltage compensation signal satisfies the following formula: $V_{ref'} = (V_{ref} - V_{R2})$. When the acquired signal VD voltage gradually becomes smaller from its maximum value, before VD declines to vt1, line voltage compensation signal is still output based on the formula $V_{ref'} = (V_{ref} - V_{R2})$; when the acquired signal VD voltage declines to be smaller than vt1, the line voltage generation module does not output voltage signal, then the Vref' of line voltage compensation signal is equal to Vref. The Vref' of line voltage compensation signal is fed back onto the circuit loop and forms an IDrain current waveform as shown in FIG. 8. It can be seen that in an instant duration in the valid power supply region of bus IDrain and close to the invalid power supply region, the change of the current flowing through a load is gentler than that in single linear compensation, and has no peak A as shown in FIG. 3.

It should be noted that, the manner that the positive input terminal of the first operational amplifier A2 receives the signal VD reflecting the bus voltage, and the negative input terminal thereof receives the first control signal is merely an example, rather than limiting the present application. In fact, according to the technical idea provided by the present application, in conjunction with the actual circuit design, the first operational amplifier A2 may also receive the first control signal at the positive input terminal and receive the signal VD reflecting the bus voltage at negative input terminal. A linear compensating circuit designed, based on the technical idea of the present application, to include the positive input terminal of the first operational amplifier A2 receiving the first control signal and the negative input terminal of the first operational amplifier A2 receiving the signal VD reflecting the bus voltage will not be described in detail.

Please refer to FIG. 9 and FIG. 22. FIG. 22 is a line voltage compensation circuit obtained in combination with FIG. 6 and FIG. 7. FIG. 9 is a waveform diagram showing that the line voltage compensation circuit in FIG. 22 supplies line voltage compensation signal correspondingly along with the change of the acquired signal VD reflecting bus voltage. Wherein the first reference voltage vt2 is smaller than the baseline voltage Vref; an input terminal of the line voltage generation module is connected with an output terminal of the first control signal generation module, e.g., the MOSFET M8 shown in FIG. 6 and the MOSFET M9 shown in FIG. 7 have common source. When VD increases from its minimum value along with the bus voltage, based on the received signal VD and the following voltage provided by the input side of the first current mirror (M5 and M6), the first operational amplifier A2 as shown in FIG. 7 is in a linear amplification interval, voltage signal output by the first operational amplifier A2 effects on a resistor R2 via the first current mirror and the second current mirror, such that Vref' gradually drops from Vref in the first linear relationship and finally close to vt2; meanwhile, when Vref' is greater than vt2, since the voltage at a negative input terminal of transconductance amplifier Gm is greater than the voltage at a positive input terminal of transconductance amplifier Gm, a transconductance amplifier Gm outputs a negative current, which enables the fourth current mirror to be in a turn-off state. When Vref' voltage drops to be close to vt2 and further satisfies that vt2 is greater than or equal to Vref', Gm begins to output a positive current, namely, output a first control signal. The first control signal voltage turns on the fourth current mirror (M7 and M8), such that the fourth current mirror (M7 and M8) shunts the current flowing to the second current mirror (M9 and M10) in the line voltage generation module. In this way, the current at an output terminal of the second current mirror declines in a lower speed, and Vref' declines continuously in a second linear relationship along with the rise of the VD voltage. In the period in which VD declines from its maximum value along with the bus voltage, the line voltage compensation signal output by the line voltage compensation circuit firstly rise according to the second linear relationship, and then rise according to the first linear relationship. The bus waveform which is fed back is as shown by the IDrain waveform in FIG. 9. It can be seen that in the period in the valid power supply region of bus IDrain and close to a voltage peak, the change of the current flowing through a load is gentler than that in single linear compensation.

It should be noted that the manner in which the positive and negative input terminals of the transconductance Gm receives the signal is merely an example, rather than limiting the present application. In fact, according to the technical idea provided by the present application, in conjunction with an actual circuit design, the transconductance Gm may also receive the fed-back line voltage compensation signal at the positive input terminal and receive the first reference voltage vt2 at the negative input terminal. A linear compensating circuit designed, based on the technical idea of the present application, to include the positive input terminal of the transconductance Gm receiving the fed-back line voltage compensation signal and the negative input terminal receiving the first reference voltage vt2 will not be described in detail.

Based on the above two intervals of segment-based control of the first control signal generation module, in one implementation, the line voltage compensation circuit includes: a first control signal generation module, a second control signal generation module and a line voltage generation module. Wherein the line voltage generation module regulates the baseline voltage to generate the line voltage compensation signal with different linear coefficients based on the first control signal and the second control signal respectively generated by the first control signal generation module and the second control signal generation module.

In some implementations, the first control signal generation module generates a first control signal based on a first reference voltage preset according to the change of signal reflecting bus voltage. The second control signal generation module generates a second control signal based on the change of the line voltage compensation signal. The line voltage generation module triggers corresponding voltage division circuit or shunt circuit under the control of the first control signal and the second control signal along with the change of the signal reflecting bus voltage, and then regulates the baseline voltage to obtain line voltage compensation signal which change in a segment-based linear manner. For example, the line voltage generation module segments voltage division compensation nodes of the line voltage compensation signal based on the first control signal, and the second control signal segments shunt nodes of the line voltage compensation signal.

It should be noted that, based on the reference voltage respectively set in the first control signal generation module and the second control signal generation module, the line voltage generation module can firstly perform linear adjustment on the baseline voltage to achieve the line voltage compensation signal based on the first control signal, and then perform linear adjustment on the baseline voltage to achieve the line voltage compensation signal based on the second control signal; or can firstly perform linear adjustment on the baseline voltage to achieve the line voltage compensation signal based on the second control signal, and then perform linear adjustment on the baseline voltage to achieve the line voltage compensation signal based on the first control signal.

In some specific examples, please refer to FIG. 10 which is a circuit schematic diagram of a line voltage compensation circuit in one implementation. The first control signal generation module 21 includes: a third current mirror (M3 and M4), a second switching device M1 and a second operational amplifier A1. The second control signal generation module 22 includes: a transconductance amplifier Gm and a fourth current mirror (M7 and M8). The line voltage generation module includes: a first operational amplifier A2, a first current mirror (M5 and M6), a second current mirror (M9 and M10) and a first switching device M2. Wherein a positive input terminal of the second operational amplifier A1 is connected with a generation circuit of the first reference voltage, a negative input terminal thereof is connected with a source of the second switching device M1, and an output terminal thereof is connected with a gate of the second switching device M1. A drain of the second switching device M1 is connected with a common gate of the third current mirror, and a source thereof is grounded via a second resistor R1. The third current mirror includes a pair of MOSFET (M3 and M4) with a common gate, drains of the pair of MOSFET (M3 and M4) are connected with a constant voltage source VDD together, and an output terminal of the third current mirror is connected with an input terminal of the line voltage generation module 23. A positive input terminal of the first operational amplifier A2 receives the signal reflecting bus voltage, a negative input terminal thereof receives the first control signal, and an output terminal thereof is connected with a gate of the first switching device M2. A drain of the first switching device M2 is connected with an input side of the first current mirror, and a source thereof is grounded via a first resistor R1. The first current mirror includes a pair of MOSFET (M5 and M6) with a common gate, drains of the pair of MOSFET (M5 and M6) are connected with a constant voltage source together, and an output terminal of the first current mirror is connected with an input terminal of the second current mirror. The second current mirror includes a pair of MOSFET (M9 and M10) with a common gate, drains of the pair of MOSFET (M9 and M10) are grounded together, and an output terminal of the second current mirror is connected with a baseline voltage source Vref via a resistor R2. Herein, the line voltage generation module changes the current flows through the resistor R2 connected between the baseline voltage generation circuit and the second current mirror, wherein the current flows through the resistor R2 varied with the current of the input terminal of the second current mirror, so that the line voltage compensation signal Vref output at the connection point between the line voltage generation module and one end of the resistor R2 and VD have segment-based linear compensation relationship.

Please refer to FIG. 11 which is a waveform diagram of each circuit node varied with the voltage of signal reflecting bus voltage VD in the circuit shown in FIG. 10. Wherein the first reference voltage vt1 is basically equal to the following voltage VR1 and is greater than the minimum value of VD, and the second reference voltage vt2 is smaller than the baseline voltage Vref. When VD gradually becomes larger from its minimum value, and in the period in which VD is smaller than vt1 and Vref' is greater than vt2, the voltage difference between the voltage of first control signal provided by the first control signal generation module and VD does not suffice to fall within the linear amplification interval of the first operational amplifier A2, and the first switching device M2 is turned off; meanwhile, since the voltage at a negative input terminal of the transconductance amplifier Gm is greater than the voltage at a positive input terminal of the transconductance amplifier Gm, namely, the Vref' of line voltage compensation signal is greater than the second reference voltage vt2, based on the characteristics of the transconductance amplifier, the transconductance amplifier Gm outputs a negative current, and the fourth current mirror is enabled to be in a turn-off state, then the output line voltage compensation signal is output based on the baseline voltage in the first linear relationship, namely, Vref'=Vref. When VD becomes larger continuously and is in a period in which VD is greater than or equal to vt1 and Vref' is greater than vt2, the voltage difference between the voltage of first control signal provided by the first control signal generation module and VD falls within the linear amplification interval of the first operational amplifier A2, meanwhile, the transconductance amplifier Gm still outputs the negative current, which enables the fourth current mirror to be still in a turn-off state, then the first switching device M2 is turned on, the voltage difference amplified by the first operational amplifier A2 is output via the first current mirror and the second current mirror, and the line voltage compensation signal is output in the second linear relationship $V_{ref'}=(V_{ref}-V_{R2})$. When VD becomes larger continuously and is in a period in which VD is greater than vt1 and Vref' is smaller than or equal to vt2, the first operational amplifier A2 still amplifies the voltage difference between VD and the first control signal voltage, meanwhile, the transconductance amplifier Gm outputs a positive current (namely, the second control signal), such that the fourth current mirror is turned on and serves as a shunting device of the second current mirror. In this way, the current at the output terminal of the second current mirror declines in a lower speed, and Vref' continuously declines in a third linear relationship along with the rise of the VD voltage since Vref' is smaller than vt2. When VD gradually becomes smaller from its maximum value, the line voltage compensation signal gradually raise Vref' of the line voltage compensation signal in a sequence from the third linear relationship, the second linear relationship to the first linear relationship, such that in a valid power supply period in which bus supplies power, the bus current forms an IDrain current waveform as shown in FIG. 11 after linear feedback. Here, the first reference voltage vt1 and the second reference voltage vt2 may be set based on the electrical characteristics of the operational amplifier A1 and the transconductance Gm, and the voltage range of the signal reflecting the bus voltage. Therefore, it can be seen that in an instant duration in the valid power supply region of bus and close to the invalid power supply region, the change of the current flowing through a load is gentler than that in single linear compensation, and in the period in the valid power supply region of bus and close to a voltage peak, the change of the current flowing through a load is gentler than that in single linear compensation.

Based on the examples of each line voltage compensation circuit, the line voltage compensation circuit can also provide other control signal generation modules based on the change of the voltage of the signal reflecting bus voltage or based on the change of the line voltage compensation signal, so as to provide more segment-based linear adjustment to the line voltage compensation signal, such that the line voltage compensation signal is more fit to the waveform change of the bus.

To this end, step S120 further includes the following steps:

comparing the signal reflecting bus voltage and a preset first reference voltage, outputting a first control signal based on the compared result; and outputting the line voltage compensation signal based on the signal reflecting bus voltage, the first control signal and the baseline voltage;

when detecting that a fed-back line voltage compensation signal is smaller than or equal to a preset second reference voltage, outputting the line voltage compensation signal based on the signal reflecting bus voltage, the first control signal, the second reference voltage and the baseline voltage; and when detecting that a fed-back line voltage compensation signal is smaller than the third reference voltage, outputting the line voltage compensation signal based on the signal reflecting bus voltage, the first control signal, the second reference voltage, the third reference voltage and the baseline voltage; wherein the second reference voltage is smaller than the first reference voltage, and the third reference voltage is smaller than the second reference voltage.

In some implementations, the line voltage compensation circuit further includes a third control signal generation module which is electrically connected between the line voltage generation module and the second control signal generation module. The third control signal generation module is configured to receive the third reference voltage and the line voltage compensation signal, and to cut off the current path through which the current flows from the line voltage generation module to the second control signal generation module when the line voltage compensation signal is smaller than or equal to the third reference voltage. Herein, the third control signal generation module is configured to adjust the peak region of the bus voltage by utilizing the generated linear relationship.

In some specific examples, the third control signal generation module includes: a third operational amplifier A3 and a third switching device M11. Wherein a negative input terminal of the third operational amplifier A3 is configured to receive the third reference voltage, and a positive input terminal thereof is connected with a second control signal generation module; and the third switching device M11 is electrically connected with an output terminal of the line voltage generation module and an output terminal of the third operational amplifier A3.

For example, please refer to FIG. 12 which is a structural schematic diagram of the line voltage compensation circuit including a first control signal generation module 31, a second control signal generation module 32, a third control signal generation module 33 and a line voltage generation module 34. Wherein a positive input terminal of the second operational amplifier A1 is connected with a generation circuit of the first reference voltage, a negative input terminal thereof is connected with a source of the second switching device (M1), and an output terminal thereof is connected with a gate of the second switching device M1. A drain of the second switching device M1 is connected with a common gate of the third current mirror, and a source thereof is grounded via a second resistor R1. The third current mirror includes a pair of MOSFET (M3 and M4) with a common gate, drains of the pair of MOSFET (M3 and M4) are connected with a constant power source VDD together, and an output terminal of the third current mirror is connected with an input terminal of the line voltage generation module. A positive input terminal of the first operational amplifier A2 receives the signal reflecting bus voltage, a negative input terminal thereof receives the first control signal, and an output terminal thereof is connected with a gate of the first switching device M2. A drain of the first switching device M2 is connected with an input side of the first current mirror, and a source thereof is grounded via a first resistor R1. The first current mirror includes a pair of MOSFET (M5 and M6) with a common gate, drains of the pair of MOSFET (M5 and M6) are connected with a constant voltage source together, and an output terminal of the first current mirror is connected with an input terminal of the second current mirror. The second current mirror includes a pair of MOSFET (M9 and M10) with a common gate, drains of the pair of MOSFET (M9 and M10) are grounded together, and an output terminal of the second current mirror is connected with a baseline voltage source Vref via a resistor R2. A negative input terminal of a third operational amplifier A3 is configured to receive the third reference voltage vt3, and a positive input terminal thereof and the transconductance amplifier Gm together receive the Vref' of line voltage compensation signal. A drain of the third switching device M11 is connected with a terminal to which the second current mirror and the fourth current mirror (M7 and M8) are connected, and a gate thereof is connected with an output terminal of the third operational amplifier M11. An output terminal of the second current mirror serves as an output terminal of the line voltage generation module to output Vref' of line voltage compensation signal based on the baseline voltage.

Please refer to FIG. 13 which is a waveform diagram of each circuit node varied with the signal VD reflecting bus voltage in the circuit shown in FIG. 12. Wherein the first reference voltage vt1 is basically equal to the following voltage VR1 and is greater than the minimum value of VD, and the second reference voltage vt2 is smaller than the baseline voltage Vref. When VD gradually becomes larger from its minimum value, and in the period in which VD is smaller than vt1 and Vref' is greater than vt2 and vt2 is greater than vt3, the voltage difference between the voltage of first control signal provided by the first control signal generation module and VD does not suffice to fall within the linear amplification interval of the first operational amplifier A2, and the first switching device M2 in the line voltage generation module is turned off; meanwhile, since the voltage at a negative input terminal of the transconductance amplifier Gm is greater than the voltage at a positive input terminal of the transconductance amplifier Gm, namely, the Vref' of line voltage compensation signal is greater than the second reference voltage vt2, the transconductance amplifier Gm outputs a negative current, and the fourth current mirror is enabled to be in a turned-off state, and the third operational amplifier A3 controls the third switching device M11 to be in a turn-on state, then the line voltage compensation signal output by the line voltage generation module is output in the first linear relationship, namely, Vref'=Vref. When VD becomes larger continuously and is in a period in which VD is greater than or equal to vt1 and Vref' is greater than vt2, the voltage difference between the voltage of first control signal provided by the first control signal generation module and VD falls within the linear amplification interval of the first operational amplifier A2, the first switching device M2 in the line voltage generation module is turned on, meanwhile, the transconductance amplifier Gm still outputs the negative current, the fourth current mirror is turned off, and the third operational amplifier A3 controls the third switching device M11 to be still in a turn-on state, then the voltage difference amplified by the first operational amplifier A2 of the line voltage generation module is output via the first current mirror and the second current mirror, and the line voltage compensation signal is output in a second linear relationship, namely, $V_{ref'}=(V_{ref}-V_{R2})$ When VD becomes larger continuously and is in a period in which VD is greater than vt1 and Vref' is smaller than or equal to vt2, the first operational amplifier A2 still amplifies the voltage difference between VD and the first control signal voltage, meanwhile, the transconductance amplifier Gm outputs a positive current (namely, the second control signal), such that the fourth current mirror is turned on and serves as a shunting device of the second current mirror. In this way, the current at the output terminal of the second current mirror declines in a lower speed, and Vref' continuously declines in a third linear relationship along with the rise of the VD voltage since Vref' is smaller than vt2. When Vref' declines to be smaller than vt3, the third switching device M11 is turned off, such that Vref' is clamped in the fourth linear relationship, namely, a constant voltage. When VD gradually becomes smaller from its maximum value, the voltage of the line voltage compensation signal Vref' gradually rises in a sequence from the fourth linear relationship, the third linear relationship, the second linear relationship to the first linear relationship, such that in a valid power supply period in which bus supplies power, the current on a load forms an IDrain current waveform as shown in FIG. 13 after linear feedback. Here, reference voltages vt1, vt2, and vt3 may be set based on the electrical characteristics of the operational amplifiers A1, A2 and the transconductance Gm, and the voltage range of the signal reflecting the bus voltage, respectively. Therefore, it can be seen that in an instant duration in the valid power supply region and close to the invalid power supply region on a load, the change of the current flowing through a load is gentler than that in single linear compensation, and in the period in the valid power supply region on a load and close to a voltage peak, the change of the current flowing through a load is gentler than that in single linear compensation.

Each reference voltage and baseline voltage mentioned in the line voltage compensation circuit can all be provided by a baseline voltage generation circuit. The baseline voltage generation circuit can be a constant voltage source which is dedicated to supply each reference voltage and baseline voltage in the line voltage compensation circuit; and can also be shared with constant voltage source in the driver in which the line voltage compensation circuit is located. For example, the baseline voltage generation circuit is a circuit that a shared constant voltage source generates each reference voltage and baseline voltage after being voltage divided via multiple resistor divider.

Figure 20:
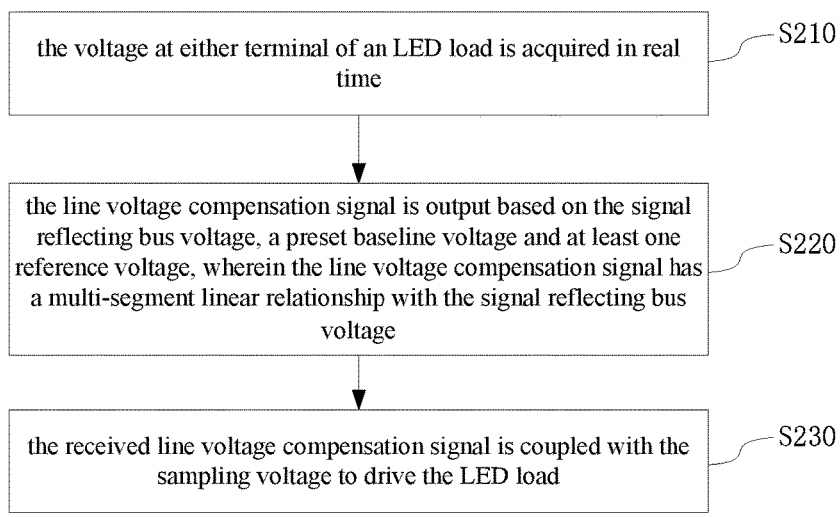
FIG. 20 is a flow chart of an LED drive method in the present application in one implementation.

Please refer to FIG. 20 which is a flow chart of an LED drive method in the present application, as shown in the figure, the LED drive method can be implemented by the LED drive system provided by the present application, or by other circuits or integrated circuits and the like which can implement the LED drive method.

In step S210, the voltage at either terminal of an LED load is acquired in real time.

Herein, the manner of acquiring the voltage in step S210 can be the same as or similar to the manner of acquiring voltage in step S110 in the above embodiments, namely, the signal reflecting bus voltage can be directly acquired from the bus circuit or load circuit which supplies power to the load. For example, the power supply line is connected with a sampling resistor, and the line voltage compensation circuit acquires the signal reflecting bus voltage from the output terminal of the sampling resistor. In some implementations, the signal reflecting bus voltage are generated by a voltage division unit based on the detected bus voltage or a voltage of a terminal of a load. Wherein the voltage division unit can be a resistor string which is connected between a bus circuit and the ground, or the voltage division unit can be a resistor string which is connected between a load circuit and the ground. The grounded resistor string is utilized to divide a branch circuit reflecting the change of current and voltage on the bus circuit from power supply line which supplies power to the load, and the line voltage compensation circuit acquires signal reflecting bus voltage from the branch circuit. For example, please refer to FIG. 4 which is a circuit schematic diagram showing the connection between the line voltage compensation circuit 12 and a load circuit via a voltage division unit 11. Wherein, the voltage division unit 11 is connected between drain (DRAIN side) of power tube (MOSFET) and the ground. The load circuit is connected with a drive circuit 13, a load connected in series with the drive circuit 13 and other peripheral circuits. Wherein, when the bus voltage (such as VBUS) reaches the voltage which enables the load to operate, the bus circuit loop is turned on, and the drive circuit 13 enables the load to operate, and when the bus voltage (such as VBUS) cannot reach the voltage which enables the load to operate, the bus circuit loop is turned off. Wherein the drive circuit in FIG. 4 includes a power device, and the power device can be a MOSFET and the like. The voltage division unit is connected with a drain (DRAIN side) of the power device, and the linear compensation circuit 12 acquires the signal VD reflecting bus voltage from a resistor side of the voltage division unit 11.

In step S220, the line voltage compensation signal is output based on the signal reflecting bus voltage, a preset baseline voltage and at least one reference voltage, wherein the line voltage compensation signal has a multi-segment linear relationship with the signal reflecting bus voltage.

The baseline voltage is directly supplied by a constant voltage source (also called baseline voltage generation circuit) or is supplied by voltage division from a voltage signal or a constant voltage. The constant voltage source can be dedicated to the line voltage compensation circuit, and can also be shared with other constant voltage sources in the chip in which the line voltage compensation circuit is located. In some embodiments, the baseline voltage is generated by baseline voltage generation circuit, which is provided to the line voltage compensation circuit via a resistor, and to be grounded. The linear compensation circuit can adjust the current flows through the resistor, so as the line voltage compensation circuit outputs a linear compensation signal which varied with the adjusted current correspondingly.

As a segment-based node voltage which performs linear compensation on the bus voltage, the reference voltage is a constant voltage supplied by a constant voltage source. Based on the design requirements of a line voltage compensation circuit, the reference voltage can serve as a segment-based node voltage that line voltage compensation circuit performs segment-based compensation based on the change of signal reflecting bus voltage. For example, the line voltage compensation circuit compares the reference voltage with the voltage of the signal reflecting bus voltage, and selects a line voltage compensation path based on the comparative results to output the line voltage compensation signal, such that corresponding to different comparative results, the line voltage compensation signals have different linear relationships with the signal reflecting bus voltage. The reference voltage can also serve as a segment-based node voltage that line voltage compensation circuit performs segment-based compensation based on the change of the line voltage compensation signal. For example, the line voltage compensation circuit compares the reference voltage with the voltage of the line voltage compensation signal, wherein the line voltage compensation signal is acquired through performing linear compensation on bus voltage based on the signal reflecting bus voltage; based on the comparative results, a line voltage compensation path is selected to output line voltage compensation signal, such that corresponding to different comparative results, the line voltage compensation signal have different linear relationships with the signal reflecting bus voltage. In consideration of cost and user experience sensitivity, one reference voltage or two reference voltage is considered. For example, the reference voltage only includes one voltage value v1, the reference voltage v1 serves as a segment-based node voltage of linear compensation, the line voltage compensation circuit supplies line voltage compensation signal with the first linear relationship between the baseline voltage Vref and v1, and supplies line voltage compensation signal with the second linear relationship between voltage v1 and a grounded voltage. For another example, the reference voltage includes voltage values v1 and v2, wherein v1 is greater than v2, the reference voltages v1 and v2 serve as the segment-based node voltage of linear compensation, the line voltage compensation circuit supplies line voltage compensation signal with the first linear relationship between the baseline voltage Vref and v1, supplies line voltage compensation signal with the second linear relationship between voltage v1 and v2, and supplies line voltage compensation signal with the third linear relationship between voltage v2 and a grounded voltage. Wherein the line voltage compensation circuit is as shown in FIGS. 5, 6, 7, 10 and 12, and will not be described in detail herein. In order to make a more detailed division of the linear relationship between the line voltage compensation signal and the received signal reflecting bus voltage, such that multi-segment linear compensation is more fit to the changing of line voltage, more reference voltages can be set in the line voltage compensation circuit in a sequence from big to small.

It should be noted that, each linear relationship should be understood in a broad sense. The linear relationship includes the linear relationship with a nonzero linear coefficient between the voltage of the line voltage compensation signal and the received signal reflecting bus voltage, or the linear relationship with zero linear coefficient between the voltage of the line voltage compensation signal and the received signal reflecting bus voltage.

Herein, the manner of outputting the line voltage compensation signal in step S220 can be the same as or similar to the manner of outputting the line voltage compensation signal in step S120 in the above embodiments, and will not be repeated redundantly herein.

In step S230, the received line voltage compensation signal is coupled with the sampling voltage to drive the LED load. Herein, this step can be implemented by the drive circuit connected with an output terminal of the line voltage compensation circuit in the LED drive system. Please refer to FIG. 14 which is a structural schematic diagram of a driver in one implementation. An output terminal of the line voltage compensation circuit 41 is connected with a positive input terminal of the operational amplifier Amp in the drive unit 42, an output terminal of the Amp is connected with a gate of a power device included in the drive unit 42, a drain of the power device is connected with a load, and a source thereof is grounded via a sampling unit. A negative input terminal of the operational amplifier Amp is connected with the sampling unit to acquire a sampling voltage, which indicating the current flows through the road. Wherein the operational amplifier Amp amplifies the voltage difference between the Vref' of line voltage compensation signal and the voltage Vcs acquired by the sampling unit, so as to drive the power device. In some embodiments, the sampling unit can include a resistor Rcs as shown in FIG. 14.

It should be noted that the current mirrors in the embodiments described in the present application are not limited to the common gate MOSFET provided in the corresponding diagrams, and may also be the common base bipolar transistor, for example.

In conclusion, in the line voltage compensation circuit, the LED drive system and the drive method in the present application, the line voltage compensation circuit regulates the baseline voltage based on the signal reflecting bus voltage (such as the voltage of a terminal of the LED load) and at least one preset threshold to output line voltage compensation signal. Compared with the line voltage compensation technology with a single slope, better input voltage line regulation and better LED current line regulation can be obtained by adopting the technical solution provided by the present application, meanwhile, in the technical solution provided by the present application, an open implementation is adopted, which enables peripheral circuits to be simpler.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A line voltage compensation circuit being configured to receive a signal reflecting bus voltage and output a line voltage compensation signal based on the received signal reflecting bus voltage, a preset baseline voltage and at least one reference voltage, wherein the line voltage compensation signal has a multi-segment linear relationship with the received signal reflecting bus voltage, the at least one reference voltage includes a first reference voltage, and the line voltage compensation circuit comprises:
    a first control signal generation module, configured to receive the first reference voltage and output a first control signal based on the first reference voltage; and
    a line voltage generation module, electrically connected with the first control signal generation module, and configured to receive the signal reflecting bus voltage, the first control signal and the baseline voltage, and generate the line voltage compensation signal based on the received signal reflecting bus voltage, the first control signal and the baseline voltage.

2. The line voltage compensation circuit of claim 1, wherein the signal reflecting bus voltage is generated by a voltage division unit based on the bus voltage or a voltage of a terminal of a load.

3. The line voltage compensation circuit of claim 1, wherein the line voltage generation module comprises:
    a first current mirror connected with a constant voltage source;
    a first switching device, wherein a drain thereof is connected with the first current mirror and a source thereof is grounded via a first resistor;
    a first operational amplifier, wherein a positive input terminal thereof is configured to receive the signal reflecting bus voltage, a negative input terminal thereof is configured to receive the first control signal, and an output terminal thereof is connected with a gate of the first switching device; and
    a second current mirror, wherein an input terminal thereof is connected with an output terminal of the first current mirror and an output terminal thereof is used for outputting the generated line voltage compensation signal based on the baseline voltage.

4. The line voltage compensation circuit of claim 1, wherein the first control signal generation module comprises:
    a third current mirror connected with a constant voltage source, wherein an output terminal thereof is connected with the line voltage generation module;
    a second switching device, wherein a drain thereof is connected with a common gate of the third current mirror and a source thereof is grounded via a second resistor; and
    a second operational amplifier, wherein a positive input terminal thereof is connected with a generation circuit of a first reference voltage, a negative input terminal thereof is connected with a source of the second switching device, and an output terminal thereof is connected with a gate of the second switching device.

5. The line voltage compensation circuit of claim 1, wherein the first control signal generation module comprises:
    a transconductance amplifier, wherein a positive input terminal thereof is connected with a generation circuit of a first reference voltage, and a negative input terminal thereof is connected with the line voltage generation module; and
    a fourth current mirror, wherein an input terminal thereof is connected with an output terminal of the transconductance amplifier and an output terminal thereof is connected with the line voltage generation module.

6. The line voltage compensation circuit of claim 1, further comprising a second control signal generation module, which is electrically connected with the line voltage generation module and configured to receive a second reference voltage and the line voltage compensation signal, and to shunt a current flowing through the line voltage generation module when the line voltage compensation signal is smaller than or equal to the second reference voltage.

7. The line voltage compensation circuit of claim 6, wherein the second control signal generation module comprises:
    a transconductance amplifier, wherein a positive input terminal thereof is configured to receive the second reference voltage, and a negative input terminal thereof is connected with the line voltage generation module; and
    a fourth current mirror, wherein an input terminal thereof is connected with an output terminal of the transconductance amplifier, and an output terminal thereof is connected with the line voltage generation module.

8. The line voltage compensation circuit of claim 6, further comprising a third control signal generation module, which is electrically connected between the line voltage generation module and the second control signal generation module and configured to receive a third reference voltage and the line voltage compensation signal, and to cut off a current path through which the current flows from the line voltage generation module to the second control signal generation module when the line voltage compensation signal is smaller than or equal to the third reference voltage.

9. The line voltage compensation circuit of claim 8, wherein the third control signal generation module comprises:
    a third operational amplifier, wherein a negative input terminal thereof is configured to receive the third reference voltage, and a positive input terminal thereof is connected with the second control signal generation module; and
    a third switching device electrically connected with the line voltage generation module and an output terminal of the third operational amplifier.

10. The line voltage compensation circuit of claim 1, further comprising a baseline voltage generation circuit configured to generate the baseline voltage and multiple reference voltages.

11. The line voltage compensation circuit of claim 10, wherein the line voltage compensation circuit is electrically connected with the baseline voltage generation circuit via a resistor.

12. A driver, comprising:
a line voltage compensation circuit, being configured to receive a signal reflecting bus voltage and an output line voltage compensation signal based on the received signal reflecting bus voltage, a preset baseline voltage and at least one reference voltage, wherein the line voltage compensation signal has a multi-segment linear relationship with the received signal reflecting bus voltage, the at least one reference voltage includes a first reference voltage, and the line voltage compensation circuit comprises:
a first control signal generation module, configured to receive the first reference voltage and output a first control signal based on the first reference voltage;
a line voltage generation module, electrically connected with the first control signal generation module, and configured to receive the signal reflecting bus voltage, the first control signal and the baseline voltage, and generate the line voltage compensation signal based on the received signal reflecting bus voltage, the first control signal and the baseline voltage; and
a drive unit, connected with the line voltage compensation circuit and a load, and configured to drive the load based on the received line voltage compensation signal and a following voltage of the load.

13. The driver of claim 12, wherein the drive unit comprises:
a power device, wherein a drain thereof is connected with the load, and a source thereof is grounded via a sampling unit; and
an operational amplifier, wherein a positive input terminal thereof is connected with the line voltage compensation circuit, a negative input terminal thereof is connected with the sampling unit to acquire the following voltage of the load, and an output terminal thereof is connected with a gate of the power device.

14. An LED drive system, comprising:
a rectifying unit configured to rectify a current input by an external AC and output the rectified current to an LED load;
an energy storage unit connected with an input terminal and an output terminal of the LED load;
a line voltage compensation circuit which is connected with the LED load, the line voltage compensation circuit is configured to receive a signal reflecting bus voltage and output a line voltage compensation signal based on the received signal reflecting bus voltage, a preset baseline voltage and at least one reference voltage, wherein the line voltage compensation signal has a multi-segment linear relationship with the received signal reflecting bus voltage, the at least one reference voltage includes a first reference voltage, and the line voltage compensation circuit comprises:
a first control signal generation module, configured to receive the first reference voltage and output a first control signal based on the first reference voltage;
a line voltage generation module, electrically connected with the first control signal generation module, and configured to receive the signal reflecting bus voltage, the first control signal and the baseline voltage, and generate the line voltage compensation signal based on the received signal reflecting bus voltage, the first control signal and the baseline voltage; and
a drive unit, connected with the line voltage compensation circuit and the LED load, and configured to drive the LED load based on the received line voltage compensation signal and a following voltage of the LED load.

15. The LED drive system of claim 14, further comprising a voltage division unit which is connected with a terminal of the LED load and the line voltage compensation circuit, and configured to generate the signal reflecting bus voltage by dividing a voltage of the terminal of the LED load and output the signal reflecting bus voltage to the line voltage compensation circuit.

16. The LED drive system of claim 14, further comprising a sampling unit connected between the drive unit and the ground, configured to output the following voltage of the LED load.

17. The LED drive system of claim 14, wherein the drive unit comprises:
a power device, wherein a drain thereof is connected with the load, and a source thereof is grounded via a sampling unit; and
an operational amplifier, wherein a positive input terminal thereof is connected with the line voltage compensation circuit, a negative input terminal thereof is connected with the sampling unit to acquire the following voltage of the load, and an output terminal thereof is connected with a gate of the power device.

18. The LED drive system of claim 14, further comprising a dimming unit configured to adjust the bus voltage so as to correspondingly adjust the brightness of the LED load;
correspondingly, the line voltage compensation circuit is configured to receive the signal reflecting bus voltage which is output after being adjusted by the dimming unit, and output the line voltage compensation signal based on the signal reflecting bus voltage, the preset baseline voltage and at least one reference voltage.

19. The LED drive system of claim 18, wherein the dimming unit comprises a triac dimmer.

20. A line voltage compensation method, comprising the following steps:
acquiring a signal reflecting bus voltage; and
outputting a line voltage compensation signal based on the signal reflecting bus voltage, a preset baseline voltage and at least one reference voltage, wherein the line voltage compensation signal has a multi-segment linear relationship with the signal reflecting bus voltage, wherein, the step of outputting a line voltage compensation signal based on the signal reflecting bus voltage, a preset baseline voltage and at least one reference voltage comprises: when comparing the signal reflecting bus voltage and a first reference voltage, outputting a first control signal based on the compared results; and outputting the line voltage compensation signal based on the signal reflecting bus voltage, the first control signal and the baseline voltage.

21. The line voltage compensation method of claim 20, wherein the step of acquiring a signal reflecting bus voltage comprises: acquiring in real time a voltage of a terminal of a load located on a bus or the bus voltage; generating the signal reflecting bus voltage by a division unit based on the bus voltage or the voltage of a terminal of a load.

22. The line voltage compensation method of claim 20, wherein the preset baseline voltage is generated by a baseline voltage generation unit.

23. The line voltage compensation method of claim 20, wherein the step of outputting a line voltage compensation signal based on the signal reflecting bus voltage, a preset baseline voltage and at least one reference voltage comprises: outputting the line voltage compensation signal based on the compared result between a fed-back line voltage compensation signal and preset at least one reference voltage, the signal reflecting bus voltage and the fed-back line voltage compensation signal.

24. The line voltage compensation method of claim 20, wherein the step of outputting a line voltage compensation signal based on the signal reflecting bus voltage, a preset baseline voltage and at least two reference voltages comprises:
   comparing the signal reflecting bus voltage and a preset first reference voltage, outputting a first control signal based on the compared results; and outputting the line voltage compensation signal based on the signal reflecting bus voltage, the first control signal and the baseline voltage;
   when detecting that a fed-back line voltage compensation signal is smaller than or equal to a preset second reference voltage, outputting the line voltage compensation signal based on the signal reflecting bus voltage, the first control signal, the second reference voltage and the baseline voltage;
   wherein the second reference voltage is smaller than the first reference voltage.

25. The line voltage compensation method of claim 20, wherein the step of outputting a line voltage compensation signal based on the signal reflecting bus voltage, a preset baseline voltage and at least three reference voltages comprises:
   comparing the signal reflecting bus voltage and a preset first reference voltage, outputting a first control signal based on the compared result; and outputting the line voltage compensation signal based on the signal reflecting bus voltage, the first control signal and the baseline voltage;
   when detecting that a fed-back line voltage compensation signal is smaller than or equal to a preset second reference voltage, outputting the line voltage compensation signal based on the signal reflecting bus voltage, the first control signal, the second reference voltage and the baseline voltage; and
   when detecting that a fed-back line voltage compensation signal is smaller than the third reference voltage, outputting the line voltage compensation signal based on the signal reflecting bus voltage, the first control signal, the second reference voltage, the third reference voltage and the baseline voltage;
   wherein the second reference voltage is smaller than the first reference voltage, and the third reference voltage is smaller than the second reference voltage.

26. The line voltage compensation method of claim 20, further comprising the following steps: generating a drive signal based on the line voltage compensation signal and a sampling signal; and
   outputting the drive signal to drive a load.

27. The line voltage compensation method of claim 26, wherein the sampling signal is output by a sampling unit, which is configured to sample a current flow through a power device connected with the load, wherein the load is LED load.

* * * * *